US008040155B2

(12) United States Patent
Tran Vo et al.

(10) Patent No.: US 8,040,155 B2
(45) Date of Patent: Oct. 18, 2011

(54) SYSTEMS AND METHODS OF INTEGRATED CIRCUIT CLOCKING

(75) Inventors: Deanne Tran Vo, Palm Harbor, FL (US); Thomas Jeffrey Bingel, Belleair Beach, FL (US)

(73) Assignee: East-West Innovation Corporation, Palm harbor, FL (US)

( * ) Notice: Subject to any disclaimer, the term of this patent is extended or adjusted under 35 U.S.C. 154(b) by 0 days.

(21) Appl. No.: 12/577,315

(22) Filed: Oct. 12, 2009

(65) Prior Publication Data

US 2010/0194434 A1 Aug. 5, 2010

Related U.S. Application Data

(60) Provisional application No. 61/206,283, filed on Jan. 30, 2009, provisional application No. 61/214,462, filed on Apr. 24, 2009, provisional application No. 61/268,906, filed on Jun. 18, 2009.

(51) Int. Cl.
*H03K 19/00* (2006.01)

(52) U.S. Cl. ............... 326/93; 326/21; 326/22; 326/28; 326/33

(58) Field of Classification Search .................. None
See application file for complete search history.

(56) References Cited

U.S. PATENT DOCUMENTS

| | | | | |
|---|---|---|---|---|
| 5,818,263 | A * | 10/1998 | Ashuri | 326/93 |
| 6,356,116 | B1 * | 3/2002 | Oh | 326/93 |
| 2002/0163361 | A1 | 11/2002 | Parkin | |
| 2007/0035428 | A1 | 2/2007 | Badaroglu | |
| 2008/0008213 | A1 | 1/2008 | Blancha | |
| 2008/0115004 | A1 * | 5/2008 | Braun et al. | 713/401 |

FOREIGN PATENT DOCUMENTS

JP 03703333 7/2005

OTHER PUBLICATIONS

Zhentao Yu, Marios C. Papaefthymiou, Xun Liu, "Skew Spreading For Peak Current Reduction" GLSVLSI'07, Mar. 11-13, 2007, Stresa•Lago Maggiore, Italy.

Yooseong Kim, Sangwoo Han, and Juho Kim , "Clock Scheduling and Cell Library Information Utilization for Power Supply Noise Reduction", Journal of Semiconductor Technology and Science, vol. 9, No. 1, Mar. 2009.

(Continued)

*Primary Examiner* — Anh Tran

(74) *Attorney, Agent, or Firm* — Thomas, Kayden, Horstemeyer & Risley, L.L.P.

(57) ABSTRACT

Various systems and methods are provided for integrated circuit clocking. In one embodiment, an integrated circuit system includes a plurality of combinational logic groups, each combinational logic group having a propagation time; and means for delaying a synchronizing clock signal supplied to at least one of the plurality of combinational logic groups based upon a period of the synchronizing clock signal and the propagation time of the at least one combinational logic group. In another embodiment, a method includes delaying a clock signal to produce a delayed clock signal and communicating the clock signal and the delayed clock signal to separate groups of the combinational logic circuit during a clock cycle that results in a reduction in power consumption by the combinational logic circuit.

29 Claims, 18 Drawing Sheets

OTHER PUBLICATIONS

P. Vuillod, L. Benini, A. Bogliolo and G. De Micheli, Clock Skew Optimization for Peak Current Reduction, Digest of the International Symposium on Low Power Electronics and Design (ISLPED), Monterey, Aug. 1996, pp. 265-270.

Badaroglu, Mustafa; Tiri, Kris;, et al., "Clock-Skew-Optimization Methodology for Substrate-noise Reduction with Supply-Current Folding", IEEE Transations on Computer-Aided Design of Integrated Circuits and Systems, vol. 25, No. 6, Jun. 2006, pp. 1146-1154.

Kourtev, Ivan S., et al., "Timing Optimization Through Clock Skew Scheduling", Springer Science+Business Media, LLC, 2009, pp. 44-6, 52-54, 108-109, 117-120, 145-159.

International Search Report and Written Opinion, mailed May 20, 2010.

* cited by examiner

SYSTEMS AND METHODS OF INTEGRATED CIRCUIT CLOCKING

CROSS REFERENCE TO RELATED APPLICATIONS

This application claims priority to the following copending U.S. provisional applications: application Ser. No. 61/206,283, entitled "Digital Integrated-Circuit Power-Supply Decoupling Method", filed on Jan. 30, 2009; application Ser. No. 61/214,462, entitled "Digital Integrated-Circuit Clock-Architecture System and Power-Supply Decoupling Method", filed on Apr. 24, 2009; and application Ser. No. 61/268,906, entitled "Digital Integrated-Circuit Clock-Architecture System and Method", filed on Jun. 18, 2009, all of which are entirely incorporated herein by reference.

BACKGROUND

Integrated circuits are utilized in a plethora of devices for many applications such as controllers for automobiles, aircraft, appliances, and toys; processors for data and voice communication equipment such as cellular telephones, personal digital assistants, and wireless or wired networks; central processing units for data centers; industrial process controllers; business and personal computers; and digital memory. Operation and performance of these devices can be adversely affected by simultaneously switching a large number of gates within the integrated circuits.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1A:
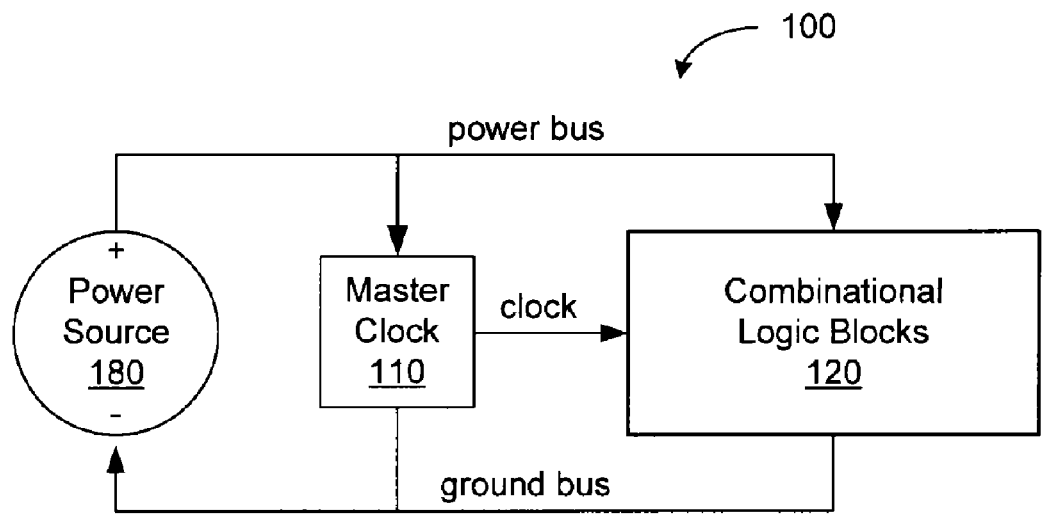
FIGS. 1A-1C are a graphical representation of a prior art integrated circuit including combinational logic blocks of digital logic paths.

Disclosed herein are various embodiments of systems and methods related to integrated circuit clocking. Reference will now be made in detail to the description of the embodiments as illustrated in the drawings, wherein like reference numbers indicate like parts throughout the several views.

An integrated circuit (IC) is a miniaturized electronic circuit that has been manufactured on a substrate. Integrated circuits containing digital logic circuitry can include digital ICs and mixed signal ICs, which contain both digital integrated circuitry and analog integrated circuitry. Digital logic ICs are classically identified by their level of complexity, e.g., by their logic gate or transistor count per die: SSI (Small Scale Integration) with few gates or transistors per die, MSI (Medium Scale Integration), LSI (Large Scale Integration), VLSI (Very Large Scale Integration) with millions of transistors, ULSI (Ultra Large Scale Integration), and WSI (Wafer Scale Integration), etc. Digital ICs may also contain a complete system on a chip (SoC) or may include multiple IC dies placed in a single package, which may be denoted as a System in Package (SIP). Additionally, multiple dies may be combined in a Multi-Chip Module (MCM). A three dimensional integrated circuit (3D-IC) utilizes two or more layers of interconnected active components.

Digital logic IC designs commonly utilize a synchronous clocking design where the toggling of digital logic gates within the digital circuitry occurs in response to a synchronizing clock signal. This synchronous clocking results in a majority of the IC digital logic gates transitioning immediately after, or nearly immediately after, an edge of the clock signal. Synchronous clock designs rely on a master (or domain) clock to provide the synchronizing clock signal. As the synchronous clock signal operates repetitively at a given clock rate or frequency, the digital logic gates are toggled repetitively in response to the synchronous clock signal. The simultaneous switching of the gates can produce switching and power-bus noise, ground bounce, and large power-bus peak (surge) currents, which may result in input threshold margin loss, timing jitter, propagation delay due to IC power-bus droop, and electromagnetic interference.

Digital logic ICs can be designed and fabricated in bipolar, CMOS, a combination of both processes, or other compounds/technologies including but not limited to, gallium nitride, gallium arsenide, and nanotube and quantum-well transistors. In many cases, digital logic ICs are designed and fabricated using CMOS techniques due to its minimal average power consumption, as well as other reasons not elaborated herein. While CMOS digital logic gates of an integrated circuit draw static and dynamic supply current, CMOS digital logic gates predominantly draw dynamic power supply current when the digital logic gate transitions in response to the clocking signal. In CMOS integrated circuits implemented with synchronous logic, the forced alignment of the digital logic gate transition time by the synchronizing clock signal plus the occurrence of the simultaneous digital logic gate transitions results in peak current demands within the digital logic IC.

FIG. 1A is a graphical representation of an integrated circuit 100 including combinational logic blocks 120 of digital logic paths. The combinational logic blocks 120 receive a synchronizing clock signal from a master (or domain) clock 110. Both the master clock 110 and the combinational logic blocks 120 receive power from power source 180 through power and ground buses. Within a digital logic IC (die) power distribution structure, power and ground buses are generally constructed of metal layers which contain resistance and exhibit inductance. This IC bus resistance and inductance impede current flow that supports digital IC operation. Digital IC power and ground conductor inductance contributes to IC die power-bus voltage drop and ground bounce due to IC power and ground conductor inductance (respectively) multiplied by di/dt (i.e., L*di/dt). Short-term reduction of IC die voltage due to Ldi/dt voltage drops in the digital logic integrated circuit power distribution causes increased digital logic propagation delay and potentially precludes completion of all digital logic transitions in a combinational logic block within the allowed synchronizing clock period. Power/ground bus noise can also be significant when a large number of gates switch simultaneously. When a large number of gates switch, the resistance and/or inductance of power/ground bus distribution paths are significant enough that IR-drop and L*di/dt values can adversely affect operation of the IC. Propagation times for the different combinational logic blocks 120 can vary between minimum and maximum propagation times based upon logical configuration, process, temperature, supply voltage, and combinational inputs.

Figure 1C:
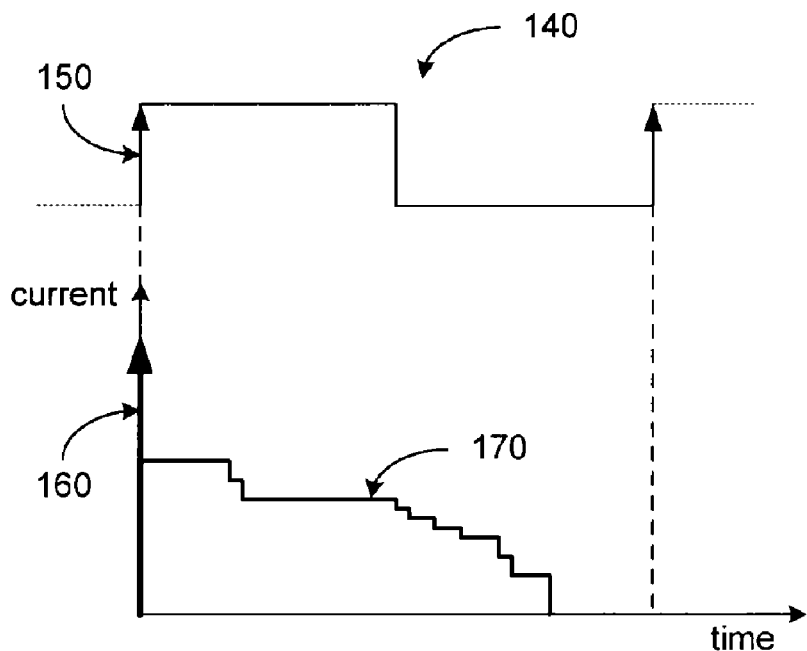
Figure 1B:
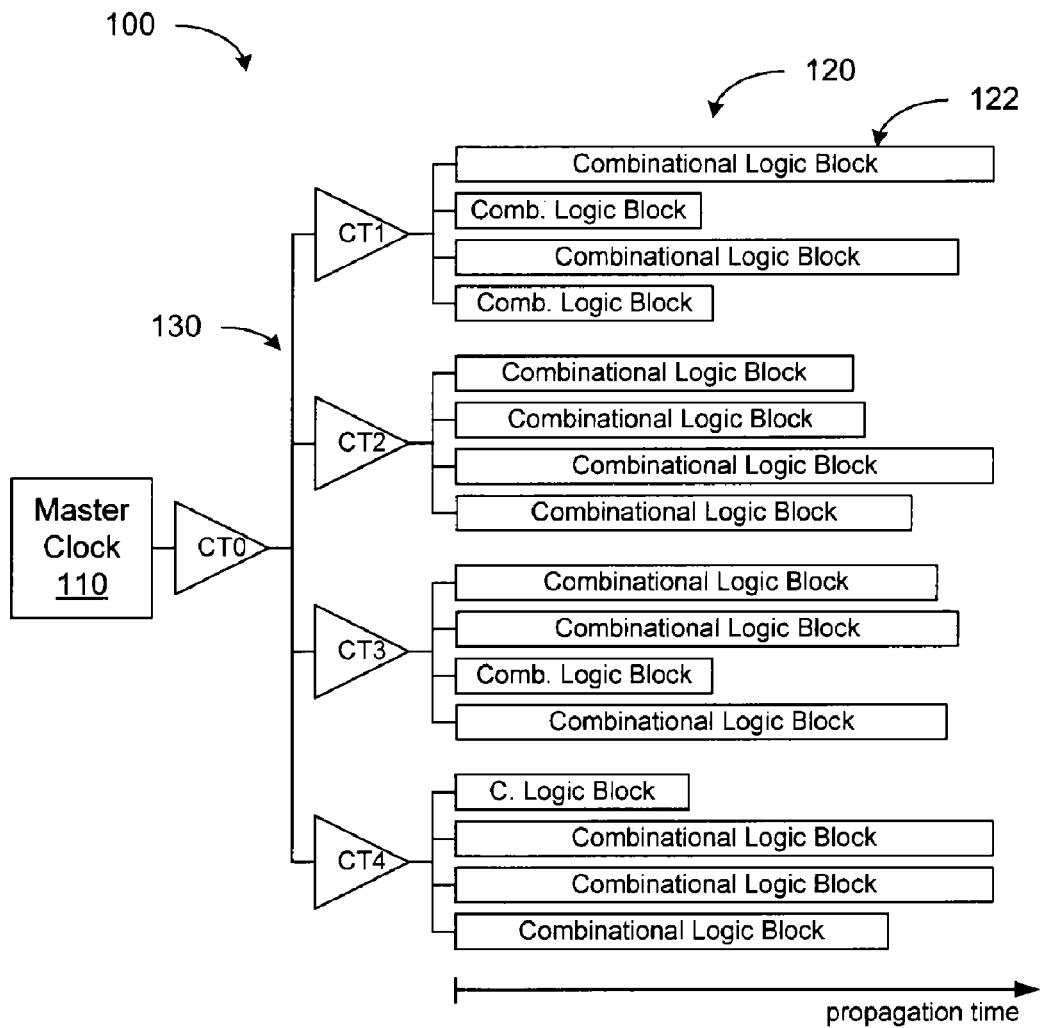

FIG. 1B is a graphical representation of a traditional synchronous clock tree 130 driving the combinational logic blocks 120 of FIG. 1A. In this exemplary embodiment of the integrated circuit 100, the synchronizing clock signal from master clock 110 is distributed by the clock tree 130 using clock tree buffers (CT0-CT4) Each individual clock tree buffer (CT1-CT4) strobes numerous combinational logic blocks 120 of varying propagation time. As depicted in FIG. 1B, the propagation time of each combinational logic block corresponds to the illustrated block length. The exact combinational logic group propagation time depends on the logic block design, the combinational input to the combinational logic block, and the inherent IC speed. For example, in the case of CMOS integrated circuits, inherent CMOS propagation speed is a function of process, voltage, and temperature (PVT).

FIG. 1C illustrates an idealized current demand for one exemplary period of the synchronizing clock signal 140 received by the combinational logic blocks 120 of FIG. 1A. With all of the combinational logic blocks 120 receiving the synchronous clocking signal, the digital logic gates transition immediately after, or nearly immediately after, a rising edge 150 of the clock signal 140. With large numbers of transitioning gates, a high peak current (or surge current) 160 can be quickly generated within an IC power-bus. After the initial surge 160, the power-bus current demand 170 is affected by the propagation through the combinational logic blocks 120. As illustrated in FIG. 1C, the current demand 170 will generally decrease over time at the signals complete their propagation through the combinational logic blocks 120.

Power-bus rms current is the effective value of current pertaining to heating and power. The rms current ($I_{RMS}$) supplied to an IC at given supply voltage ($V_{DD}$) determines the IC power by the expression, $P=I_{RMS}V_{DD}$. The rms current value ($I_{RMS}$) is closely related, and dependent on the current variance. Described in statistical terms, the standard deviation $\sigma$ (rms) is the square-root of the variance. The variance, $\sigma^2$, is a measure of the deviation of the current from the mean current. As the current variation about the mean current increases, the IC power increases. Reducing the current variance by controlling the delay in clocking combinational logic blocks or groups of combinational logic blocks can produce a reduction in IC power.

Figure 2A:
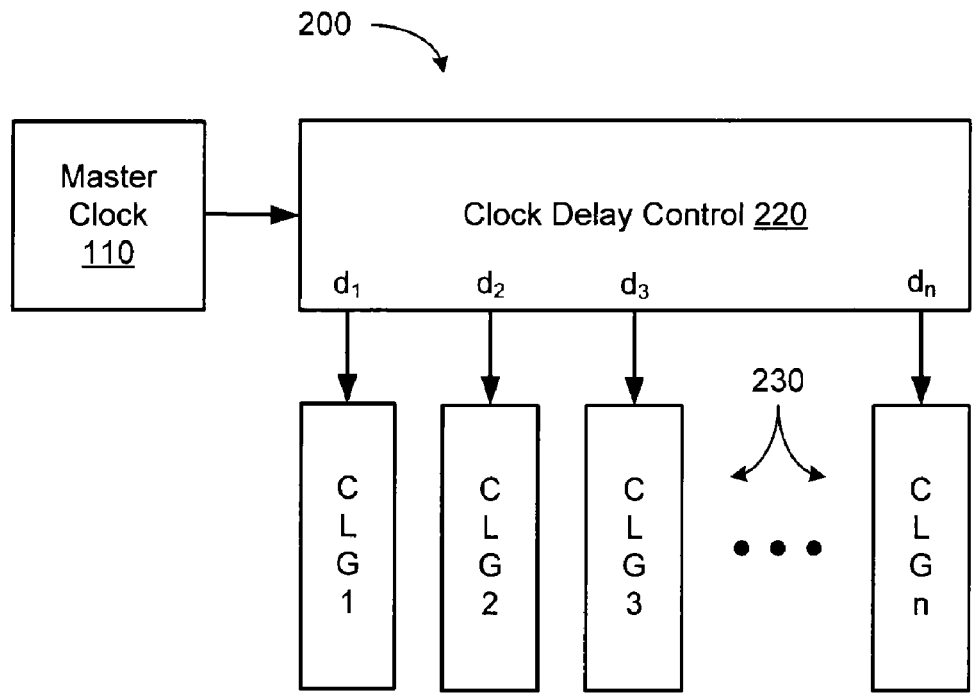
FIGS. 2A-2B are a graphical representation of an integrated circuit system including a clock delay control for controlling the delay of a synchronizing clock signal to combinational logic groups (CLG) in accordance with one embodiment of the present disclosure.

FIG. 2A is a graphical representation of an integrated circuit system 200 including a clock delay control 220 for controlling the delay of a synchronizing clock signal to combinational logic groups (CLG) 230 in accordance with one embodiment of the present disclosure. Elements of the IC system 200 may reside within one or more ICs or may reside outside the IC. In one embodiment, the clock delay control 220 may be implemented in hardware when the IC design is synthesized (generally from VHDL code). In other embodiments, the clock delay control 220 may be implemented as a combination of hardware and software executed by hardware (e.g., a processor and memory).

One or more combinational logic blocks may be grouped to form a combinational logic group 230. In one embodiment, the combinational logic blocks may be segregated or "binned" based upon the maximum propagation time of the combinational logic falling within a propagation range associated with the combinational logic group. For example, TABLE 1 lists six exemplary combinational logic blocks and their maximum propagation times.

TABLE 1

| Combinational Logic Block Number | Maximum Propagation Time (ns) |
|---|---|
| 1 | 3.0 |
| 2 | 2.5 |
| 3 | 1.0 |
| 4 | 0.7 |
| 5 | 0.5 |
| 6 | 2.7 |

In one exemplary embodiment, combinational logic blocks 1, 2, and 6 may be grouped together to form combinational logic group 1 with a limiting propagation time of about 3.0 ns and combinational logic blocks 3, 4, and 5 may be grouped together to form combinational logic group 2 with a limiting propagation time of about 1.0 ns. In this case, the propagation ranges associated with combinational logic groups 1 and 2 may be described as approximately 2.5 ns to approximately 3.0 ns and approximately 0.5 ns to approximately 1.0 ns, respectively. Alternatively, combinational logic blocks 3 and 4 may be grouped together to form combinational logic group 2 with a limiting propagation time of about 1.0 ns while combinational logic block 5 may be grouped alone to form combinational logic group 3 with a limiting propagation time of about 0.5 ns. Different groupings of the combinational logic blocks allow for the adjustment of the current demand for each combinational logic group and/or control of the number of combinational logic groups receiving delayed clocking signals.

Propagation times may be determined through simulation or testing of the IC combinational logic based upon process, temperature, supply voltage, logical configuration, and combinational inputs. In some embodiments, propagation determinations, which may include simulation calculations, are performed by the clock delay control 220. Alternatively, simulations may be performed to determine the combinational logic propagation times on separate processing or computer systems.

Figure 2B:
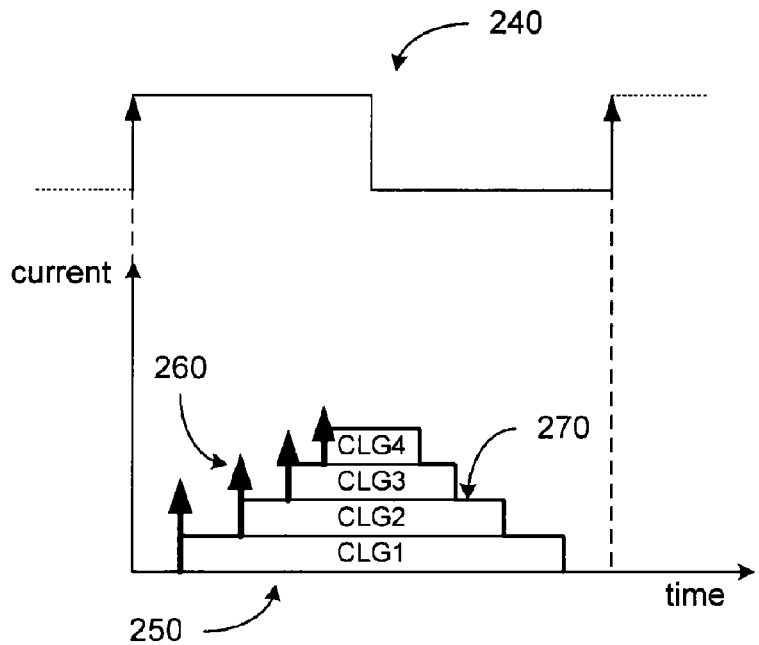

FIG. 2B illustrates an idealized current demand for one exemplary period of the synchronizing clock signal 240 received by the clock delay control 220 of FIG. 2A in accordance with one embodiment of the present disclosure. The exemplary embodiment of FIG. 2B illustrates idealized current demand 250 for four combinational logic groups (CLG1-CLG4). Each combinational logic group 230 receives a delayed clocking signal ($d_1, d_2, \ldots d_n$, where n=4 in the exemplary embodiment of FIG. 2B) from the clock delay control 220 to shift the current demand of the combinational logic group 230 within the period of the synchronizing clock signal 240. By controlling the delay of the clocking signal to each combinational logic group (CLG1, CLG2, ... CLGn), the number of digital logic gates transitioning at the same time can be reduced, allowing for the reduction of the peak current (or surge current) 260 seen on the IC power-bus. Moreover, shifting the clocking of the different combinational logic groups 230 allows for shaping of the power-bus current demand 270 which can result in reduced high frequency currents on the IC power-bus, reduced current variance, reduced rms current, reduced power consumption, decreased power/ground and simultaneous switching noise, and improved digital logic signaling noise margins.

The embodiment of FIG. 2A, which affords reduced power-bus peak current, reduces power-bus voltage drop due to the interaction of peak current with power-bus resistance. Similarly, the embodiment of FIG. 2A, which affords reduced power-bus di/dt, reduces power-bus voltage drop due to the interaction of peak current with power-bus inductance. Both of these reductions afford improved power-bus power integrity by reducing power-bus voltage drops and ground bounce, and reduce the power-bus or power supply decoupling capacitor needs (whether incorporated within the IC, within the IC packaging, or within or on the printed circuit board containing the IC).

Figure 3A:
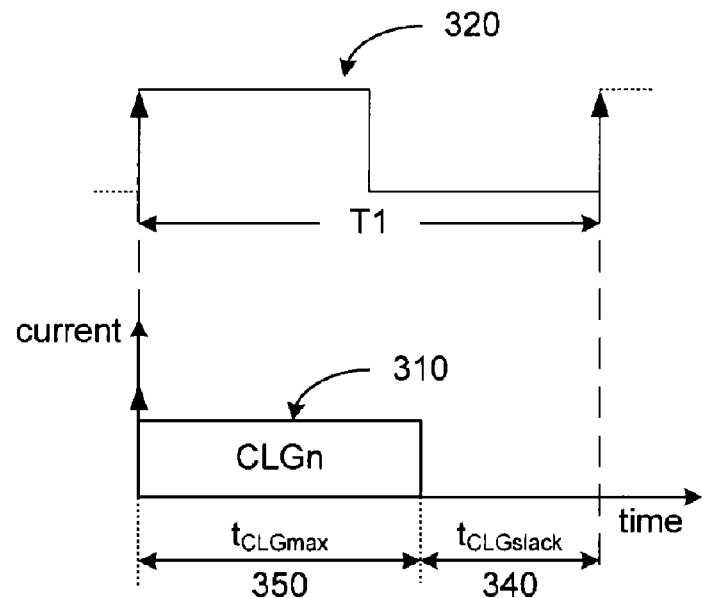
FIG. 3A-3B depict the relationship between the propagation delay of a combinational logic group of FIG. 2A and a period of the synchronizing clock signal in accordance with one embodiment of the present disclosure.
Figure 3B:
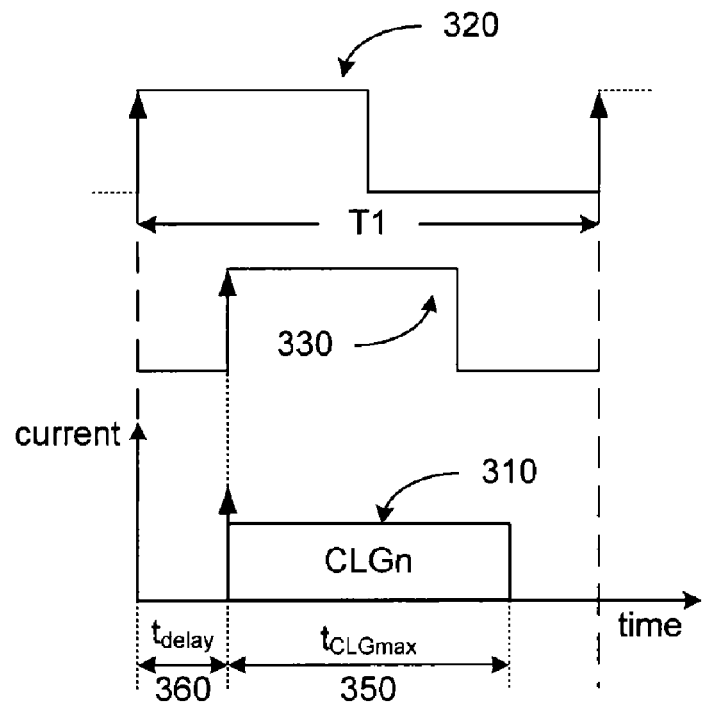

The appropriate clock delay can be determined based on static timing analysis or statistical timing analysis of the combinational logic group slack. FIGS. 3A-3B depict the relationship between the propagation delay 310 of a combinational logic group CLGn of FIG. 2A and a period of the synchronizing clock signal 320. By sending a delayed clock signal 330 to the corresponding combinational logic group, the timing of the combinational logic operation can be shifted within the synchronizing clock period 320. As illustrated in FIG. 3A, the synchronizing clock signal 320 has a period of T1. The slack time ($t_{CLGslack}$) 340 can be calculated as the difference between the synchronizing clock period of T1 and the limiting propagation delay time ($t_{CLGmax}$) 350 of the combinational logic group CLGn. As discussed above, the limiting propagation delay time 350 is approximately the maximum propagation time of the combinational logic blocks forming to the combinational logic group. In some embodiments, the limiting propagation delay time 350 is the maximum propagation time of the combinational logic blocks forming to the combinational logic group, while in other embodiments the limiting propagation delay time 350 is near the maximum propagation time of the combinational logic blocks.

While every IC has at least one combinational logic block that is the critical path where there is technically no slack at the highest possible clock frequency, operation of the IC under nominal conditions is at less than the maximum designed clock frequency. An operating IC is, in general, not operating at the simultaneous worst-case combination of PVT (process, voltage, and temperature conditions producing the slowest digital logic propagation speed), and thus, an operating IC generally has more timing slack than worst-case simulations indicate. In that case, there is at least some slack time available for the critical path of the IC. In addition, at least one combinational logic block will have a propagation time that is less than the critical path propagation time. For example, referring back to FIG. 1B, if combinational logic block 122 corresponds to the critical path of the IC, then the other combinational logic blocks 120 will have as much or more slack as combinational logic block 122. Accordingly, when the combinational logic blocks are grouped to form combinational logic groups 230, each CLG 230 will have as much or more slack as the combinational logic block corresponding to the critical path.

The clock delay control 220 may then provide a delayed clock signal 330 to the combinational logic group CLGn as illustrated in FIG. 3B based upon the determined $t_{CLGslack}$ 340. The delay time ($t_{delay}$) 360 of the delayed clock signal 330 is less than then $t_{CLGslack}$ 340 to ensure that propagation through the combinational logic group is complete before the next synchronizing period begins. In the embodiment of FIG. 3B, the delay, $t_{delay}$ 360, is approximately half the slack time $t_{CLGslack}$ 340, resulting in the limiting propagation time period 310 being approximately centered within the synchronizing clock period. In other embodiments, $t_{delay}$ 360 can be other fractions of $t_{CLGslack}$ 340.

Figure 4A:
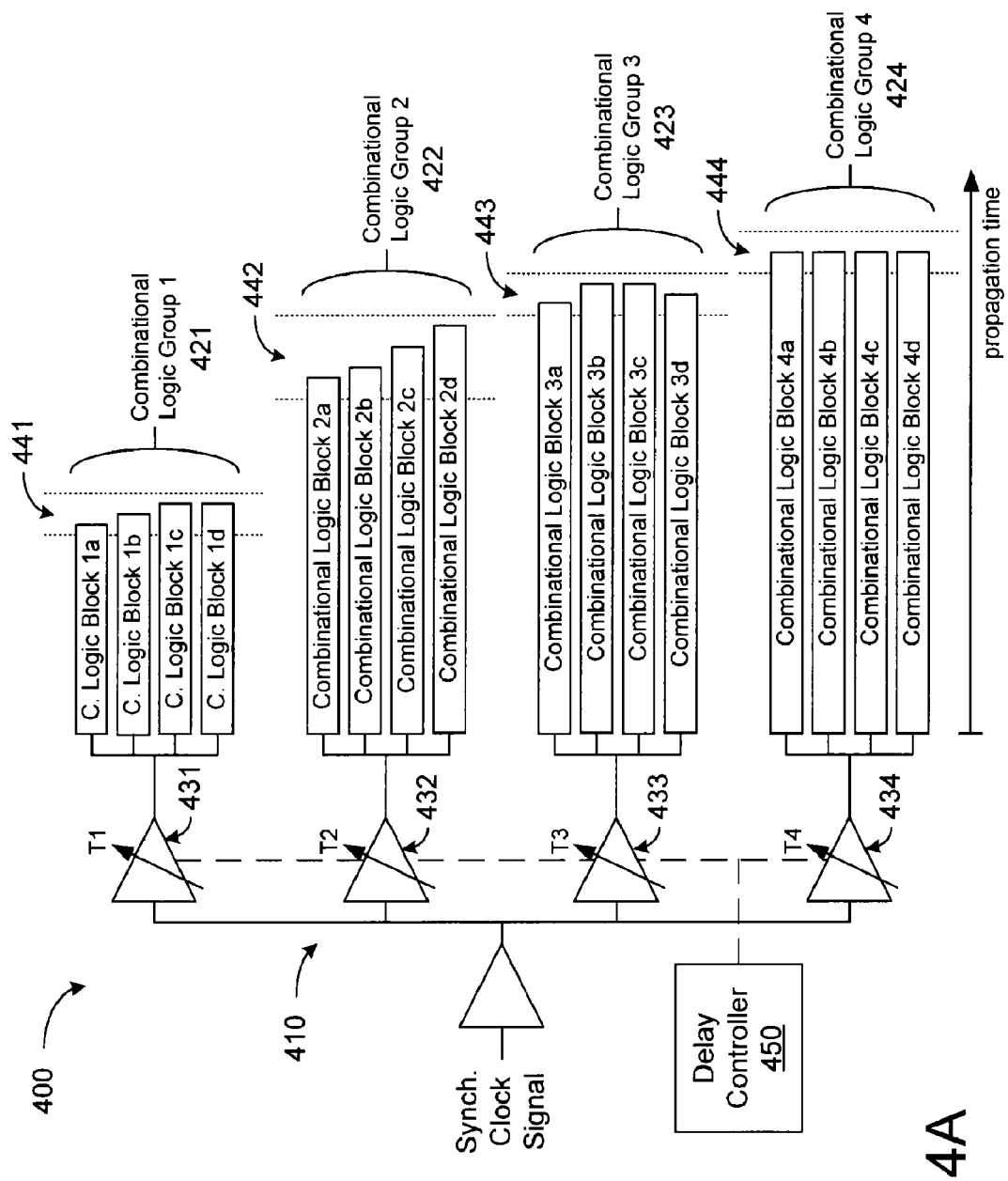
FIGS. 4A and 4B are graphical representations of embodiments of the clock delay control comprising a clock tree including controllable clock delay elements in accordance with the present disclosure.

FIG. 4A is a graphical representation of one embodiment of the clock delay control in accordance with the present disclosure. The exemplary clock delay control 400 of FIG. 4A comprises a clock tree 410 that receives a synchronizing clock signal from, for example, the master clock 110. The clock tree 410 includes one or more controllable clock delay elements which supply a delayed clock signal to a corresponding combinational logic group. In the embodiment of FIG. 4A, the combinational logic has been separated into four combinational logic groups (CLG1-CLG4) 421-424, each receiving a delayed clock signal from one of four controllable clock delay elements 431-434.

As depicted in FIG. 4A, the limiting propagation time of each combinational logic block corresponds to the illustrated block length. The combinational logic blocks have been grouped based upon their maximum propagation times falling within a propagation range 441-444 associated with the combinational logic group. While the exemplary embodiment of FIG. 4A depicts the combinational logic including equal numbers of combinational logic blocks, other embodiments may include groupings with different numbers of combinational logic blocks. In addition, the same or overlapping propagation ranges may be associated two or more combinational logic groups to allow the combinational logic blocks falling within the propagation ranges to be divided between multiple clock delay elements.

A delay controller 450 is also included in the clock delay control 400. The delay controller 450 monitors the synchronizing clock signal and controls each of the clock delay elements 431-434 to provide a delayed synchronizing clock signal to each combinational logic group 421-424, respectively. In some embodiments, a single delay controller 450 is utilized to control all of the clock delay elements; while in other embodiments, the delay controller 450 includes an individual group delay controller for each clock delay element 431-434.

The limiting propagation time ($t_{CLGmax}$) for one or more of the combinational logic groups may be calculated by the delay controller 450 or may be determined from design simulations. For example, in the embodiment of FIG. 4A, $t_{CLGmax}$ for combinational logic group 2 (CLG2) 422 is approximately the maximum propagation time for combinational logic block 2$d$, while $t_{CLGmax}$ for combinational logic group 3 (CLG3) 423 is approximately the maximum propagation time of combinational logic blocks 3$b$ and 3$c$. Based on the period (T1) of the synchronizing clock signal, the delay time ($t_{delay}$) for each of the combinational logic groups 421-424 can be determined and used to control each of the clock delay elements 431-434 to delay of the clock signals provided to the combinational logic groups 421-424. In some embodiments, the signal delay caused by the signal propagating through the clock tree 410 is also considered in the control of the clock delay elements 431-434.

Figure 4B:
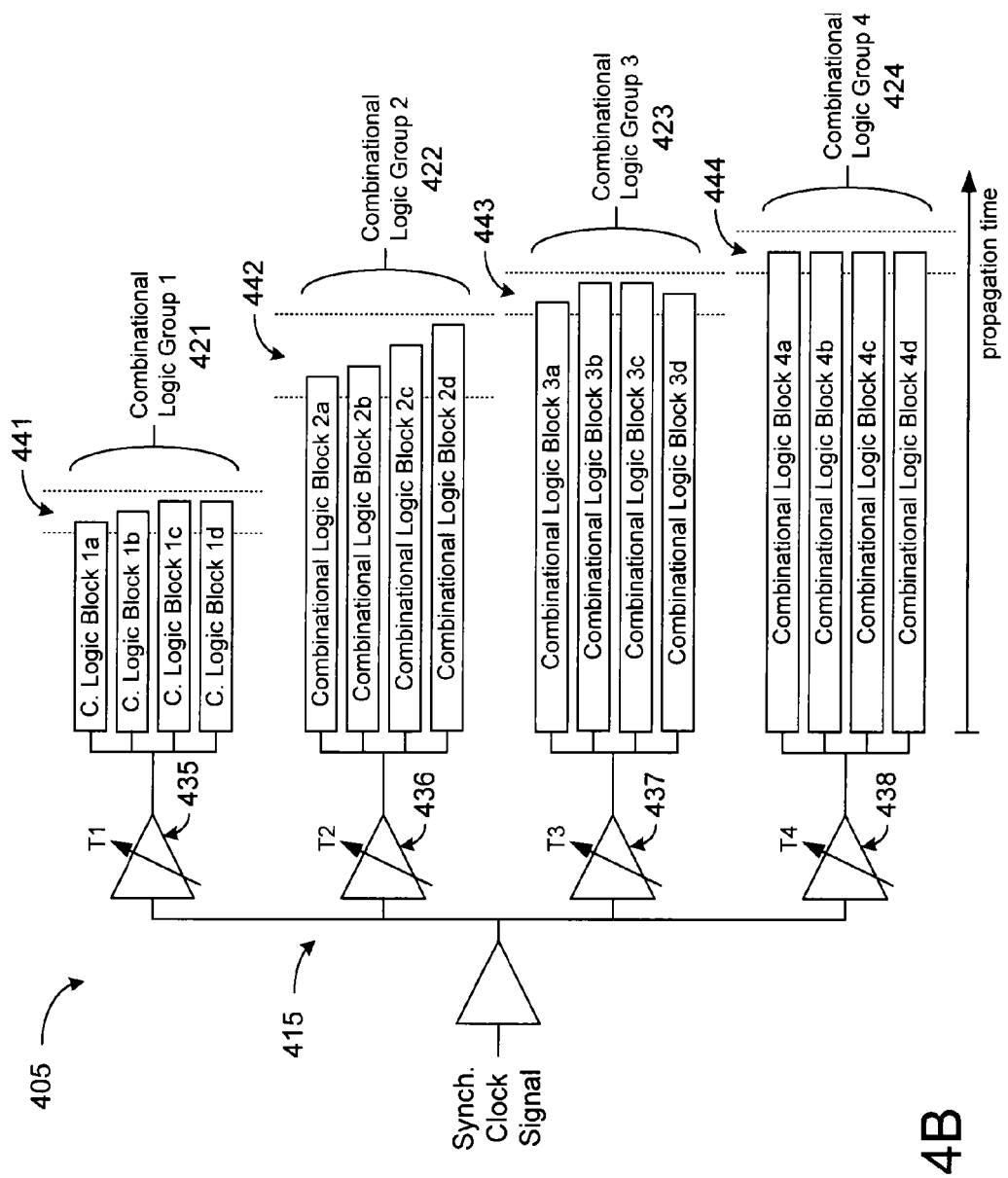

FIG. 4B is a graphical representation of another embodiment of the clock delay control 405 in accordance with the present disclosure. The clock tree 415 includes one or more clock delay elements which supply a delayed clock signal to a corresponding combinational logic group. In the embodiment of FIG. 4B, the combinational logic has been separated into four combinational logic groups (CLG1-CLG4) 421-424, each receiving a delayed clock signal from one of four controllable clock delay elements 435-438. In this embodiment, the controllable clock delay elements 435-438 are not controlled by a separate delay controller 450.

As depicted in FIG. 4B, the limiting propagation time of each combinational logic block corresponds to the illustrated block length. The combinational logic blocks have been grouped based upon their maximum propagation times falling within a propagation range 441-444 associated with the combinational logic group. While the exemplary embodiment of FIG. 4B depicts the combinational logic groups including equal numbers of combinational logic blocks, other embodiments may include groupings with different numbers of combinational logic blocks. In addition, the same or overlapping propagation ranges may be associated with two or more combinational logic groups to allow the combinational logic blocks falling within the propagation ranges to be divided between multiple clock delay elements.

The limiting propagation time ($t_{CLGmax}$) for one or more of the combinational logic groups may be determined from design simulations. For example, in the embodiment of FIG. 4B, $t_{CLGmax}$ for combinational logic group 2 (CLG2) 422 is approximately the maximum propagation time for combinational logic block 2$d$, while $t_{CLGmax}$ for combinational logic group 3 (CLG3) 423 is approximately the maximum propagation time of combinational logic blocks 3$b$ and 3$c$. Based on the period (T1) of the synchronizing clock signal, the delay time ($t_{delay}$) for each of the combinational logic groups 421-424 can be determined and used to control each of the clock delay elements 435-438 to delay of the clock signals provided to the combinational logic groups 421-424. In some embodiments, the signal delay caused by the signal propagating through the clock tree 415 is also considered in the control of the clock delay elements 435-438.

Figure 5:
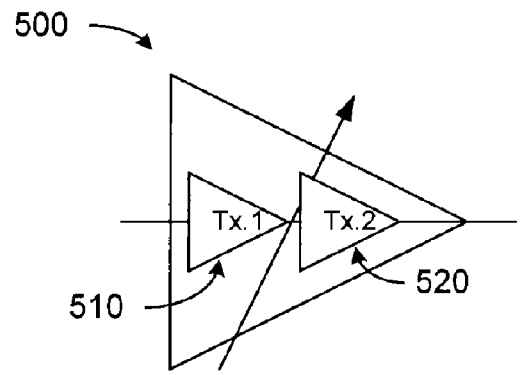
FIG. 5 illustrates an exemplary embodiment of a controllable clock delay element of FIGS. 4A and 4B in accordance with the present disclosure.

FIG. 5 illustrates an exemplary embodiment of a controllable clock delay element of FIGS. 4A and 4B in accordance with the present disclosure. In the embodiment of FIG. 5, the clock delay element 500 is graphically represented as including a delay element 510 representing the controllable intrinsic propagation delay Tx.1 of the delay element circuitry and a controllable output stage driver element 520 representing the delay Tx.2 of the extrinsically controllable drive strength. Increasing clock driver strength produces a reduction in propagation delay Tx.2. The combination of the intrinsic propagation delay Tx.1 and the extrinsically controllable delay Tx.2 represents the delay of the clock signal provided to the associated combinational logic group. In some embodiments, the combination of the intrinsic propagation delay 510 and the extrinsically controllable delay 520 may be controlled to reduce the driver power consumption of clock delay element 500. With many VLSI and SOC IC designs consuming 30-50% of their total power in the clock architecture, clock power conservation can provide substantial operational improvements. In other embodiments, the combination of the intrinsic propagation delay 510 and the extrinsic delay 520 may be chosen to reduce power-bus di/dt and/or rms current.

In one embodiment, the delays Tx.1 and Tx.2 may be fixed during IC fabrication to be less than the slack time of the associated combinational logic group. A library of drivers may be used to match the driver design with the associated combinational logic group based upon simulation data of the combinational logic group propagation delay time, $t_{CLGmax}$. Alternatively, IC software tools may automatically design and/or build a clock delay element 500, with Tx1 and Tx.2 synthesized appropriately for the design considerations, for each combinational logic group in the design.

In other embodiments, one or both of the controllable delays 510 and/or 520 are controlled to produce a desired effect for the combinational logic group being supplied. For example, the controllable intrinsic propagation delay Tx.1 of the clock delay element 510 and/or the controllable extrinsic delay Tx.2 of the output stage driver 520 can be designed to produce a pseudo-random delayed clock ($t_{delay}$) within the bounds of zero and the slack time ($t_{CLGslack}$) for the associated combinational logic group. This random clocking affords "noise whitening" and de-correlates power-bus noise from the clock.

Because combinational logic blocks with short propagation times are grouped together, the clock delay element driver can be made "weak" to conserve clock power. While the additional intrinsic propagation delay of the "weak" driver reduces the range over which the clock delay can be controlled, the short propagation time for the combinational logic group still allows for substantial control. For example, it is common that the combinational logic propagation time of state machines to be in the range of 5-10% of the synchronizing clock period. With such short propagation times, the intrinsic propagation delay produces a manageable impact upon the delay of the synchronizing clock signal. In some embodiments, combinational logic groups may be sequentially clocked by utilizing different intrinsic propagation delays for each of the clock delay element. In other embodiments, the intrinsic propagation delays may be designed to cascade combinational logic groups with short propagation times within the synchronizing clock period, with further delay adjustment provided by the extrinsically controllable delay.

Figure 6A:
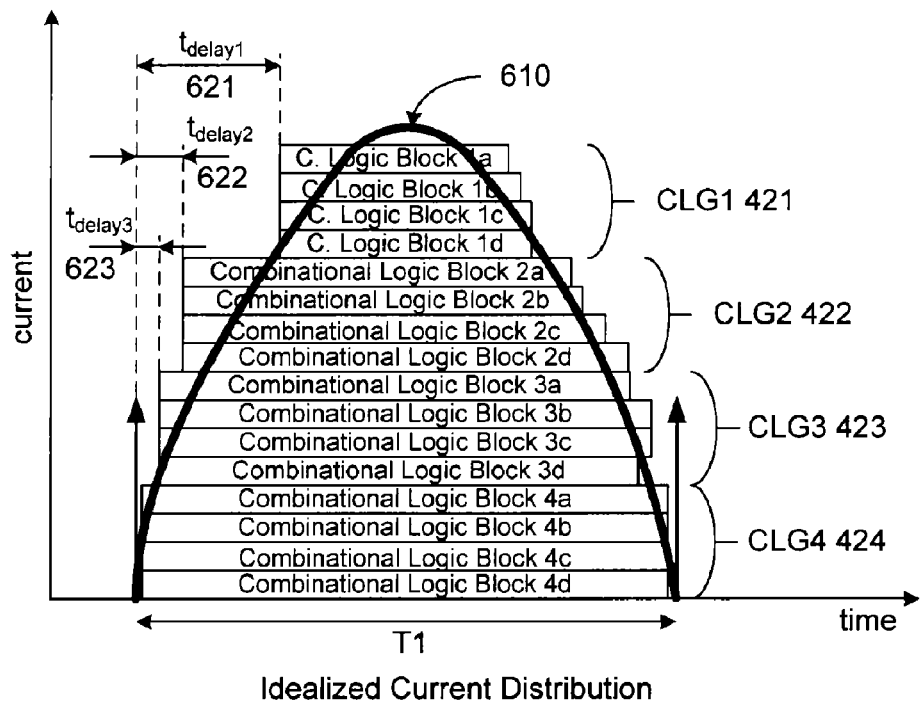
FIGS. 6A-6B, 7 and 8 illustrate idealized power-bus currents resulting from delaying combinational logic groups using the controllable clock delay elements of FIGS. 4A and 4B in accordance with embodiments of the present disclosure.
Figure 6B:
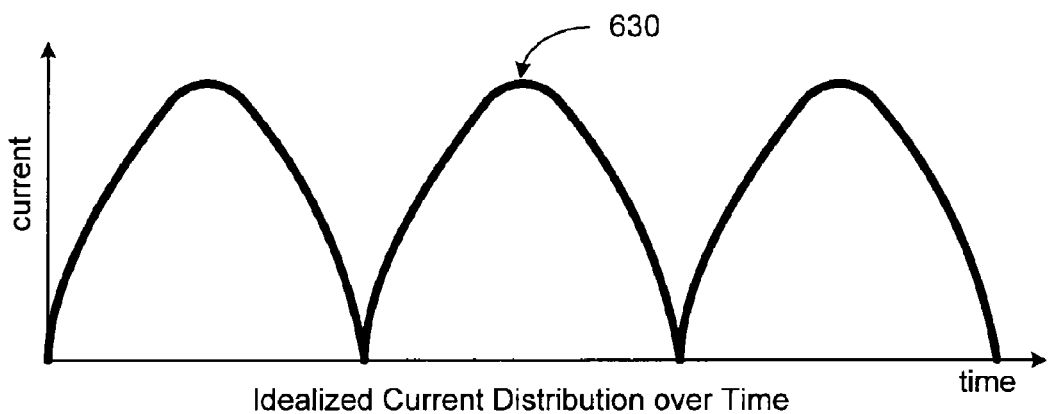

FIGS. 6A-6B illustrate idealized power-bus currents resulting from delaying combinational logic groups (CLG1-

CLG4) 421-424 using the controllable clock delay elements 431-434 of FIGS. 4A and 4B in accordance with one embodiment of the present disclosure. In the embodiment of FIG. 6A, the delay times ($t_{delay}$) have been determined to center the limiting switching interval (i.e., the limiting propagation time) of each combinatorial logic group (CLG1-CLG4) 421-424 within the synchronizing clock period T1. In the embodiment of FIG. 6A, the delay times for CLG1-CLG3 are indicated as 621-623, respectively. The delay time for CLG4 is not shown. As can be seen in FIG. 6A, the delay ($t_{delay1}$) 621 of the clock signal sent to CLG1 produced by clock delay element 421 is longer that the delays ($t_{delay2}$ and $t_{delay3}$) 622 and 623 of the clock signals sent to the other combinational logic groups. By delaying the clocking of each group to approximately center the limiting propagation times, the resulting IC power-bus current 610 has a smoother current shape including a reduced rate of change in the power-bus current (di/dt). When operating at a synchronous clock period T1 or perhaps greater, maintaining the CLG delays in this fashion results in a more constant power-bus current 630, as illustrated in FIG. 6B, having less current variance, and thus lower rms current, reducing power consumption, and having reduced high frequency content with lower power-bus noise content.

Moreover, the more constant power-bus current illustrated in FIG. 6B, which has a reduced power-bus peak current, reduces power-bus voltage drop due to the interaction of peak current with power-bus resistance. Similarly, the more constant power-bus current illustrated in FIG. 6B, which has a reduced power-bus di/dt, reduces power-bus voltage drop due to the interaction of peak current with power-bus inductance. Both of these reductions afford improved power-bus power integrity by reducing power-bus voltage drops and ground bounce. Consequently, the power-bus or power supply decoupling capacitor needs (whether incorporated within the IC, within the IC packaging, or within or on the printed circuit board containing the IC) are reduced.

In the embodiment of FIG. 6A, the delay times ($t_{delay}$) have been adjusted to approximately center the limiting propagation time of each combinatorial logic group 421-424 within the synchronizing clock period T1. In other embodiments, the combinatorial logic groups may be delayed by predetermined intervals. For example, the delay times may be multiples of some fraction of the clock period (e.g., 5%, 10%, 15%, . . . of the clock period T1). In one embodiment, there is no delay for CLG4, the delay for CLG3 is 5% of T1, the delay for CLG2 is 10% of T1, and the delay for CLG4 is 15% of T1. Alternatively, the delay for CLG4 may be 20% of T1. The delay times are selected so that the maximum propagation for each group is completed before the next synchronizing clock period begins. In some embodiments, the same delay time may be used for multiple combinatorial logic groups.

As illustrated in FIG. 6A, the exemplary IC is operating at approximately the maximum clock speed, rate, or frequency based upon the limiting propagation time of the combinational logic included in combinational logic group 4 (CLG4) 424. Approximately centering the limiting propagation time of each combinational logic group may also be implemented when operating below the maximum clock rate. Additionally, while FIG. 6A illustrates delaying the combinational logic groups 421-424 to center their limiting propagation times within the synchronizing clock period T1, it should be noted that when the synchronizing clock rate is below or less than maximum, other embodiments may delay the combinational logic groups so that the limiting propagation time of each combinational logic group is offset by a constant amount from the center of the clock period. The delay times are selected so that the limiting propagation for each group is completed before the next synchronizing clock period begins.

Figure 7:
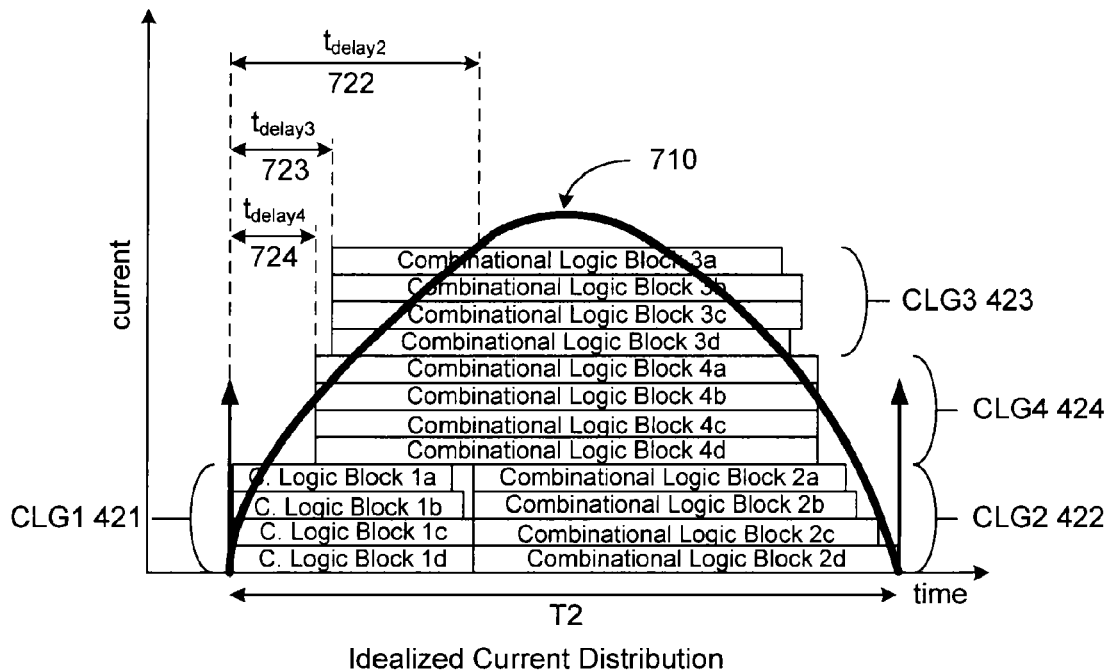

In addition, at synchronizing clock rates or frequencies below the maximum clock speed, the delay times may be adjusted by the clock delay control 220 (FIG. 2A) to "cascade" and/or "stack" the switching intervals of the combinational logic groups 421-424. For example, FIG. 7 illustrates an idealized power-bus current resulting from delaying combinational logic groups (CLG1-CLG4) 421-424 using the controllable clock delay elements 431-434 of FIGS. 4A and 4B in accordance with another embodiment of the present disclosure. In the exemplary embodiment of FIG. 7, the clock rate allows for combinational logic groups 1 and 2 (421 and 422) to be cascaded within the synchronizing clock period T2 (i.e., the clocking of combinational logic group 2 (CLG2) 422 is delayed after the clocking of combinational logic group 1 (CLG1) 421 by delay ($t_{delay2}$) 722, which is approximately the limiting propagation time of CLG1). As depicted in FIG. 7, the clocking of CLG1 (421) is initiated before CLG2 (422). In other embodiments, the ordering may be reversed.

In the exemplary embodiment of FIG. 7, the clocking of the combination of groups CLG1 and CLG2 (421-422) are delayed to approximately center the combined limiting propagation times of CLG1 and CLG2 within the synchronizing clock period T2. The clock signals sent to combinational logic groups 3 and 4 (423-424) are delayed ($t_{delay3}$ and $t_{delay4}$) 723 and 724 to approximately center the limiting propagation times of CLG3 and CLG4. As noted with respect to FIGS. 6A-6B, delaying the clocking to center the limiting propagation times results in the IC power-bus current 710 having a smoother current shape, including a reduced rate of change in the power-bus current (di/dt), and less high frequency content. In addition, cascading the clocking of groups CLG1 and CLG2 (421-422) results in a lower power-bus rms current level than that depicted in FIG. 6A.

It should be noted that, with shorter synchronizing clock periods, the time delay ($t_{delay2}$) 722 may be less than the limiting propagation time of CLG1 (421), resulting in overlap of the two groups CLG1 and CLG2. While this may result in a higher power-bus current level (than that illustrated in FIG. 7) during the overlap, the power-bus rms current level, power-bus peak current, as well as the di/dt and high frequency content, may still be lower than that depicted in FIG. 6A.

Further, operation at even lower synchronous clock speeds, rates, or frequencies can allow for other orderings of the clocking of combinational logic groups. For example, when an IC is operated at substantially less than the maximum master clock speed, combinational logic groups can be cascaded to provide an approximately constant power-bus current level over the synchronizing clock period, reducing both peak power-bus current, rms power-bus current, and power-bus di/dt.

Figure 8:
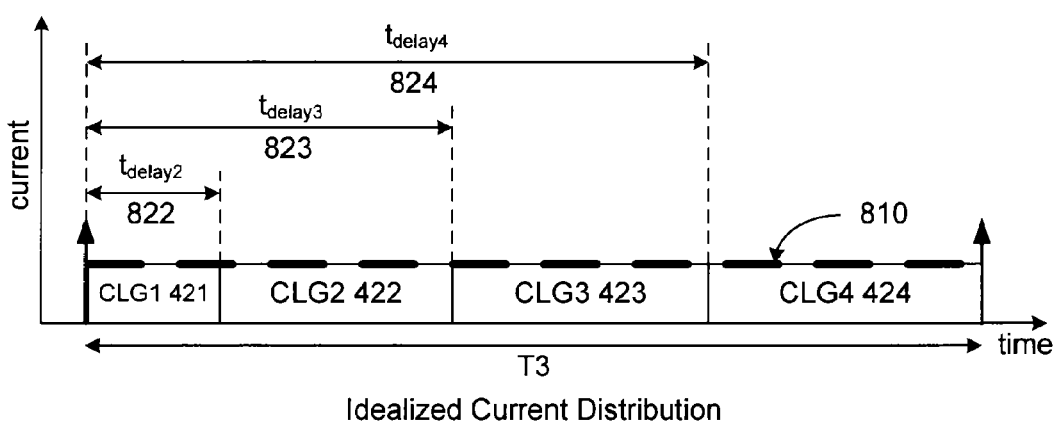

In the exemplary embodiment of FIG. 8, the low clock rate allows for combinational logic groups 1-4 (421-424) to be cascaded within the synchronizing clock period T3, providing a constant idealized current 810. As illustrated in FIG. 8, each of the combinational logic groups 422-424 is sequentially delayed 822-824 until after the limiting propagation times of the previous combinational group 421-423, respectively. For example, the delay time $t_{delay2}$ 822 is approximately the limiting propagation time of CLG1 (421), the delay time $t_{delay3}$ 823 is approximately the combined limiting propagation times of CLG1 and CLG2 (421-422), and the delay time $t_{delay4}$ 824 is approximately the combined limiting propagation times of CLG1, CLG2, and CLG3 (421-423).

By monitoring the synchronizing clock frequency from the master clock, delays of the combinational logic groups may be dynamically induced by the clock delay control 220 (FIG. 2A) at clock rates lower than maximum clock speed to provide power-bus current management within the IC. For example, in the embodiment of the clock delay control 400 in FIGS. 4A and 4B, normal operation of the IC may occur at approximately maximum clock rate, with the combinational logic groups 1-4 (421-424) delayed as illustrated in FIG. 6A. When a sleep mode is actuated, the synchronous clock frequency may be reduced substantially below the maximum clock rate, as illustrated in FIG. 8. In response to the reduction in the clock frequency, the delay controller 450 adjusts the delay times to cascade each of the combinational logic groups 421-424 as illustrated in FIG. 8. In this way, the power-bus current may be dynamically controlled for different clock frequencies. Peak power-bus current, rms power-bus current, and power-bus di/dt may be reduced.

As a result of the combinational logic blocks being grouped by maximum propagation time, in addition to delaying the clock signal provided to the combinational logic groups the clock driver may be sized to afford further or complementary power reduction. For example, a weaker driver may be utilized to provide the clocking signal to combinational logic groups with a greater slack time.

Figure 9:
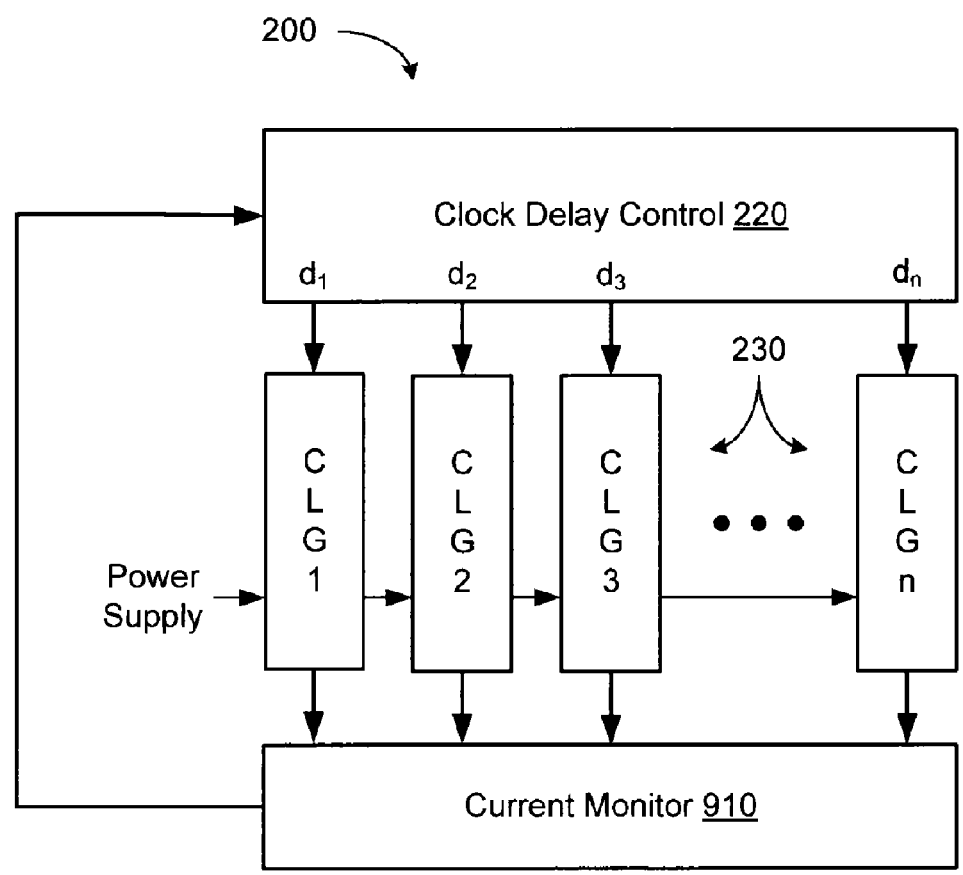
FIG. 9 is a graphical representation of the integrated circuit system of FIG. 2A further including a current monitor providing feedback to the clock delay control in accordance with one embodiment of the present disclosure.

In other embodiments, feedback may be provided to the clock delay control 220 to allow for adjusting the combination logic group clock delays to minimize measured peak or rms power-bus currents. FIG. 9 is a graphical representation of the integrated circuit system of FIG. 2A further including a current monitor 910 providing feedback to the clock delay control in accordance with one embodiment of the present disclosure. In the embodiment of FIG. 9, a current monitor 910 senses power-bus current for one or more of the combinational logic groups 230 and provides a feedback signal (e.g., measured peak or rms current) to the clock delay control 220. The clock delay control 220 may then utilizes this information to adjust the individual delays $d_1, d_2, d_3, \ldots d_n$, to effect a desired output response. The desired output response may be minimizing peak current or total rms current to within a predefined limit or tolerance. In the exemplary embodiment of FIG. 9, a single current monitor 910 is used to measure aggregate peak or rms current as the control loop output. In other embodiments, the current monitor 910 may include multiple group current monitors (e.g., one for each combinational logic group or for each combinational logic block). The output from each group current monitor may then be provided back to the clock delay control 220.

Alternatively, some embodiments may provide feedback to the clock delay control 220 to allow for adjusting the combination logic group clock delays based upon monitored operational conditions of one or more combinational logic blocks. Individual or combined sensors can be used to provide process, voltage, and temperature (PVT) operating parameters for the monitored IC. The sensors may be strategically located on or integrated into the IC to account for process, bus voltage, and temperature gradients within the IC. In some embodiments, sensors may also be used to monitor the actual propagation time through a combinational logic block. This logistic approach applies to both 2-dimensional and 3-dimensional integrated circuits.

Figure 10A:
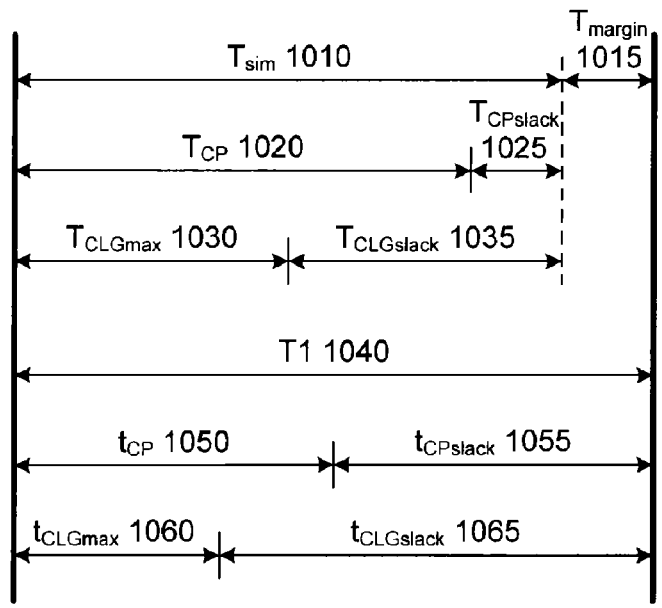
FIGS. 10A-10B illustrate the use of monitored operational conditions of a combinational logic block as feedback to the clock delay control of FIG. 2A in accordance with one embodiment of the present disclosure.
Figure 10B:
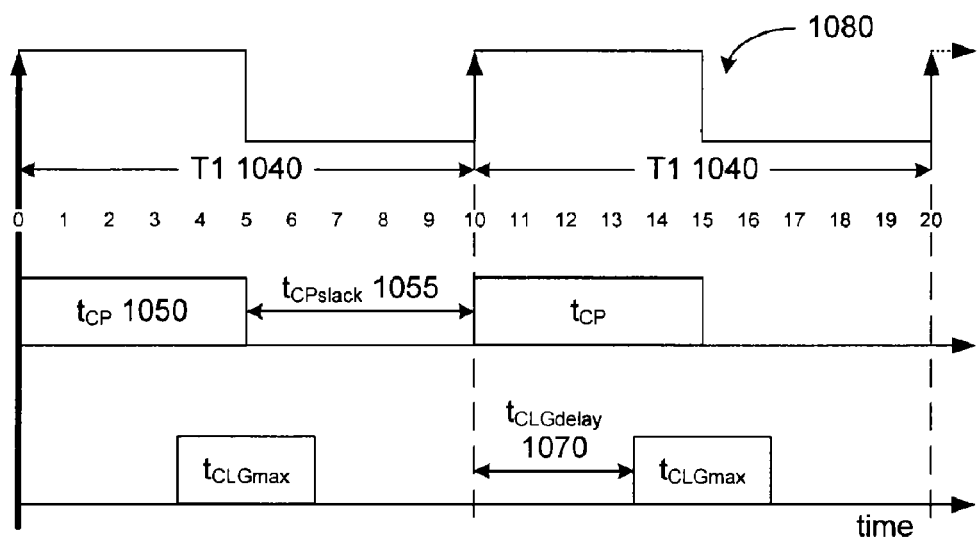

FIGS. 10A-10B illustrate the use of monitored operational conditions of a combinational logic block as feedback to the clock delay control 220 of FIG. 2A in accordance with one embodiment of the present disclosure. For example, consider the combinational logic block that corresponds to the critical path (or the critical path logic block) of the IC. The critical path logic block can provide an indication of the IC operating speed, which is a function of the IC PVT. In FIG. 10A, a critical path propagation delay ($T_{CP}$) 1020 can be determined from simulation of the critical path logic block at a clock rate having a simulation period $T_{sim}$ (1010). Similarly, the limiting propagation time ($T_{CLGmax}$) 1030 for one or more of the combinational logic groups (or the propagation time of a combinational logic block) may be determined from the simulation at the simulation clock rate. Slack times for the critical path ($T_{CPslack}$ 1025) and the combinational logic group ($T_{CLGslack}$ 1035) can also be determined from $T_{sim}$ 1010, $T_{CP}$ 1020, and $T_{CLGmax}$ 1030.

FIG. 10A also illustrates the relationship between the operating clock period (T1) 1040 and the operating critical path propagation delay ($t_{CP}$) 1050 and critical path slack ($t_{CPslack}$) 1055. Knowing the relationship between the critical path propagation delay ($T_{CP}$) 1020 and the limiting propagation time ($T_{CLGmax}$) 1030 of a combinational logic group from the simulation results, it is possible to estimate the operating slack ($t_{CLGslack}$ 1065) of the combinational logic group from the operating clock period (T1) 1040 and the operating critical path propagation delay ($t_{CP}$) 1050 during operation of the IC. The estimation of the slack can be expressed as:

$$t_{CLGslack} = T1 - \frac{t_{CP}}{T_{CP}} \cdot T_{CLGmax}$$

The operating limiting propagation time ($t_{CLGmax}$) 1060 for the combinational logic group may also be estimated from this information. The margin between $T_{sim}$ 1010 and T1 1040 is indicated at $T_{margin}$ 1015.

FIG. 10B illustrates how determination of $t_{CPslack}$ 1055 during operation is utilized to determine the combinational logic group delay ($t_{CLGdelay}$) 1070 for the subsequent synchronizing clock period 1080. In one embodiment, while the IC is operating at the clock rate correspond to the period T1, the propagation time for the critical path is measured. For example, when propagation through the critical path logic block is completed and $t_{CP}$ 1050 goes low at time=5 of FIG. 10B, a timer counter is enabled. The timer counter ceases the time measurement when the synchronizing clock signal goes high at time=10. The combinational logic group slack time ($t_{CLGslack}$) 1065 may be determined as described above. The combinational logic group slack time ($t_{CLGslack}$) 1065 may then be provided to the clock delay control 220 (FIG. 2A) for adjustment of the group delay ($t_{CLGdelay}$) 1070 during subsequent synchronizing clock periods.

In other embodiments, either the operating critical path propagation delay ($t_{CP}$) 1050 or the operating critical path slack ($t_{CPslack}$) 1055 may be determined based upon measurements of other PVT conditions of the IC. For example, a look-up table may be used to determine $t_{CP}$ 1050 and/or $t_{CPslack}$ 1055 based upon the measured conditions. Alternatively, a predetermined function may be used to determine $t_{CP}$ 1050 and/or $t_{CPslack}$ 1055 based upon the measured operating PVT conditions.

In other embodiments, a replicated critical path may be used to monitor the limiting critical path propagation time. The critical path propagation time may vary based upon the critical path logic block inputs and the logic where the critical logic path resides. To ensure that the limiting critical path propagation time is monitored during any given synchronizing clock period, the limiting critical logic path may be replicated as a separate combinational logic block having inputs that always produce the limiting critical path propagation time. This replicated critical path can be located proximal to the operating critical path logic block to minimize any PVT gradient variation between the replicated critical path and the actual critical path. The replicated critical path logic block may then be monitored to determine the critical path's maximum potential logic delay independent of variations produced by the critical path logic block inputs and the logic.

It should be noted that the slack of a combinational logic group may be similarly estimated based upon monitored information associated with combinational logic blocks that are not the critical path. In addition, the combinational logic group including the critical path logic group may also be delayed based upon the $t_{CPslack}$ 1055. The delay of the critical path logic block and its corresponding combinational logic group is less than $t_{CPslack}$ 1055 (i.e., $0 \leq t_{CPdelay} \leq t_{CPslack}$ 1055) to ensure complete propagation through the critical path within the clock period T1 1040. In this case, the slack time for the critical path may be determined based upon the $t_{CPdelay}$ and the measured time between completion of propagation through the critical path logic block (e.g., when $t_{CP}$ goes low) and the beginning of the next clock cycle (e.g., when the synchronizing clock signal goes high).

Figure 11A:
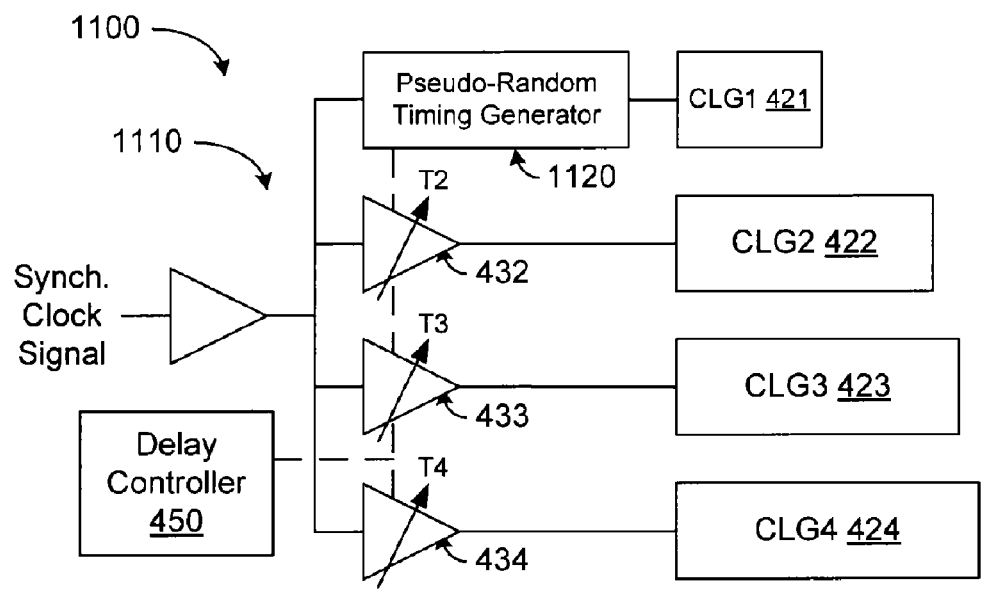
FIGS. 11A-11B are a graphical representation of another embodiment of the clock delay control of FIGS. 4A and 4B including a pseudo-random timing generator in accordance with the present disclosure.
Figure 11B:
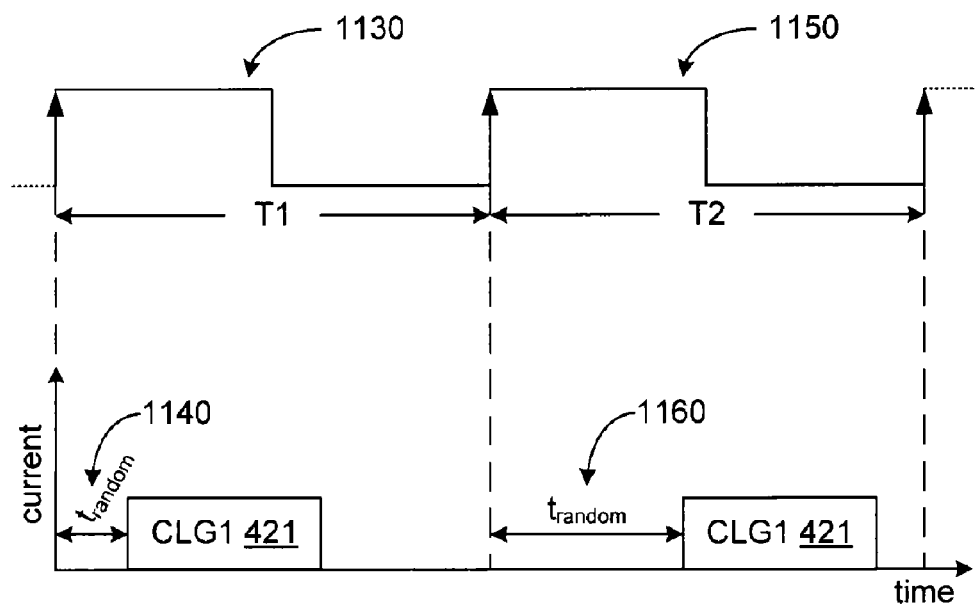

Other embodiments of the clock delay control 220 may also randomly vary the delay time of one or more combinational logic group to create non-periodic or non-pattern dependent noise from the IC. Minimization of periodic and pattern dependent noise is very beneficial in signal processing systems, such as communications systems, instrumentation, test and measurement equipment, medical devices, etc. To accomplish this, one or more of the clock delay elements 431-434 of FIGS. 4A and 4B may be replaced by a pseudo-random timing generator. In the exemplary embodiment of FIG. 11A, the clock delay control 1100 includes a clock tree 1110 with the pseudo-random timing generator 1120 in place of clock delay element 431. The pseudo-random timing generator 1120 provides a pseudo-random time-shifted clock ($t_{random}$), bound by a zero time shift to a maximum time shift of value of $t_{CLGslack}$ (see FIGS. 3A-3B). That is:

$$0 \leq t_{random} \leq t_{CLGslack}$$

where $t_{CLGslack}=T_X-T_{CLGmax}$, $T_X$ is the synchronizing clock period, and $T_{CLGmax}$ is the limiting propagation delay for the combination logic group receiving the delayed clocking signal (i.e., CLG1 421 for the embodiment of FIGS. 11A-11B). In some embodiments, the combinational logic group slack time ($t_{CLGslack}$) 1065 determined during operation of the IC may be used to limit $t_{random}$. As shown in FIG. 11B, modifying the delay time between subsequent clock periods in a pseudo-random fashion, non-periodic or non-pattern dependent power-bus current demands can be produced. Since power-bus noise is related to power-bus current demand interacting with power-bus parasitics such as resistance and inductance, power-bus noise is made pseudo-random or non-correlated with the synchronizing clock. During a first synchronizing clock period T1 (1130), a first pseudo-random time-shift $t_{random}$ 1140 is used to clock CLG1 421. In the subsequent synchronizing clock period T2 (1150), a second pseudo-random time-shift $t_{random}$ 1160 is used to clock CLG1 421. As illustrated in FIG. 11B, the propagation through combinational logic group 421 is completed within the clock periods 1130 and 1150.

In the embodiment of FIG. 11A, the remaining clock delay elements 432-434 are controlled by the delay controller 450 as discussed previously with respect to FIGS. 4A and 4B. The delay controller 450 may also provide the pseudo-random timing generator 1120 with synchronizing clock rate and/or slack time ($t_{CLGslack}$) to allow the pseudo-random timing generator 1120 to generate the clock signal for combinational logic group 1 (421). Alternatively, the pseudo-random timing generator 1120 may operate independently from the delay controller 450. If two or more pseudo-random timing generators are utilized, uncorrelated operation may be used to whiten the total noise of the IC power-bus. In other embodiments, the pseudo-random control may be included in the delay controller 450, which may then control one or more of the clock delay elements 431-434 to provide a pseudo-random clock signal to its corresponding combinational logic group 421-424, respectively.

Figure 12:
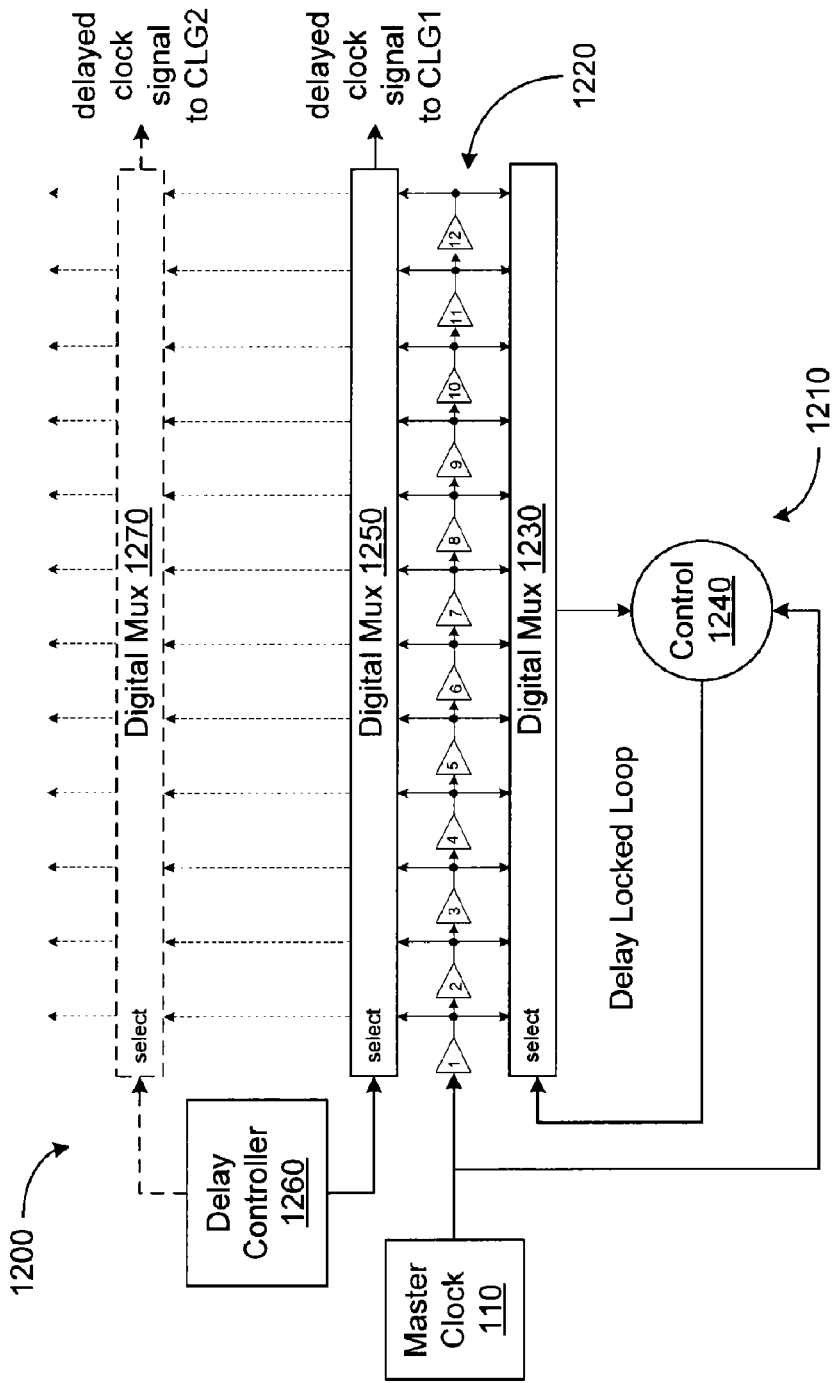
FIG. 12 is a graphical representation of another embodiment of the clock delay control of FIG. 2A comprising a delay locked loop in accordance with the present disclosure.

FIG. 12 is a graphical representation of another embodiment of the clock delay control 220 of FIG. 2A comprising a delay locked loop in accordance with the present disclosure. The exemplary clock delay control 1200 of FIG. 12 comprises a delay locked loop 1210 that receives a synchronizing clock signal from, for example, the master clock 110. In the embodiment of FIG. 12, the delay lock 1210 includes twelve delay stages 1220 with their outputs supplied to a digital multiplexer (digital mux) 1230. The number of delay stages 1220 and their delay times may vary between embodiments. The delay lock loop control section 1240 selects the output of the delay stages 1220 such that the output of digital mux 1220 is 360 degrees out-of-phase with the synchronizing clock signal received from master clock 110 (i.e., 0 degrees). As the frequency of the synchronizing clock signal changes, control section 1240 adjusts the output of digital mux 1220 to maintain an output that is 360 degrees out-of-phase. The delay stage output that is selected corresponds to the gradation of the clock delays that may be provided to the combinational logic groups.

The clock delay control 1200 also includes digital mux 1250 for selecting the delayed clock output for a combinational logic group (e.g., CLG1). Delay controller 1260 controls the selection of the output of mux 1250 based upon the synchronizing clock frequency (or period) and the limiting propagation delay of the corresponding combinational logic group as discussed previously with respect to FIGS. 4A and 4B. The selected output of mux 1230 may also be used by delay controller 1260 is the output determination. In some embodiments, a separate delay locked loop, digital mux, and delay controller are provided for each combinational group. In other embodiments, a common delay locked loop 1210 may be utilized to supply two or more combinational logic groups through multiple digital mux units (1250, 1270, . . . ), each or which selects a delayed output for their corresponding combinational logic group. Multiple mux units (1250, 1270, . . . ) may be controlled by a single delay controller 1260; while in other embodiments, the delay controller 1260 includes an individual group delay controller for each digital mux.

For simplicity, assume in one exemplary embodiment, that the delay locked loop 1210 selects buffer 10 of digital mux 1230 (corresponding to the output of the tenth delay stage 1220) for a nominal synchronizing signal period, with nominal IC process, voltage, and temperature. Likewise, assume that the delay locked loop 1210 selects buffer 12 of digital mux 1230 (corresponding to the output of the twelfth delay stage 1220) for the maximum synchronizing signal period, with fast integrated circuit process, high voltage, and low temperature—all factors causing fast digital signal propagation within the IC. Additionally, assume that the delay locked loop selects buffer 8 of digital mux 1230 (corresponding to the output of the eighth delay stage 1220) for minimum synchronizing signal period, with slow integrated circuit process, low voltage, and high temperature—all factors causing slow digital-signal propagation within the IC.

The delay controller 1260 sets digital mux 1250 to a delay that generally centers the limiting propagation time of the corresponding combinational logic group ($t_{CLGmax}$) within the current synchronizing clock period T1 (or any synchronizing clock period Tn). For example, let the synchronizing period T1=10, corresponding to the nominal delay time, and the tenth delay stage 1220 be selected by delay lock loop control section 1240. Also, let the CLG1 propagation times be $t_{CLGmin}$=2, $t_{CLGtypical}$=4, $t_{CLGmax}$=6 corresponding to slow, nominal, and fast IC operation (PVT), respectively. Under nominal conditions, digital mux 1230 is set to buffer 10 output to satisfy the 360-degree delay condition (one clock period delay), which is the same as zero-degree delay under steady-state conditions. Digital mux 1250 is set to provide the delayed signal of buffer 3 to CLG1 (e.g., with the synchronizing clock signal centered at buffer output 10/2=5, subtracting $t_{CLGtypical}$/2 provides the buffer number selected (3) to approximately center CLG1 operation within period T1; i.e., 5−(4/2)=3).

Under fast IC operating conditions at the maximum synchronizing signal period, digital mux 1230 is set to buffer 12 output, for example, to satisfy the 360-degree delay condition (one clock period delay), which is the same as zero-degree delay under steady-state conditions. Digital mux 1250 is set to buffer 5 (e.g., with the synchronizing clock signal centered at buffer output 12/2=6, subtracting $t_{CLGmin}$/2 provides the buffer number selected (5) to approximately center CLG1 operation within period T1; i.e., 6−(2/2)=5). Similarly, under slow IC operating conditions at the minimum synchronizing signal period, digital mux 1230 is set to buffer 8 output to satisfy the 360-degree delay condition (one clock period delay), which is the same as zero-degree delay under steady-state conditions. Digital mux 1250 is set to buffer 1 (e.g., with the synchronizing clock signal centered at buffer output 8/2=4, subtracting $t_{CLGmax}$/2 provides the buffer number selected (1) to approximately center CLG1 operation within period T1; i.e., 4−(6/2)=1).

As discussed previously with respect to FIGS. 4A and 4B, the delay controller 1260 can dynamically shift the mux settings, and thus the delay times, as the synchronizing clock speed or rate changes. In addition, the delay controller 1260 can determine whether combinational logic groups can be "cascaded" and/or "stacked" and select the mux outputs appropriately. Feedback from a current monitor may also be used to reduce peak and/or rms power-bus current.

Figure 13A:
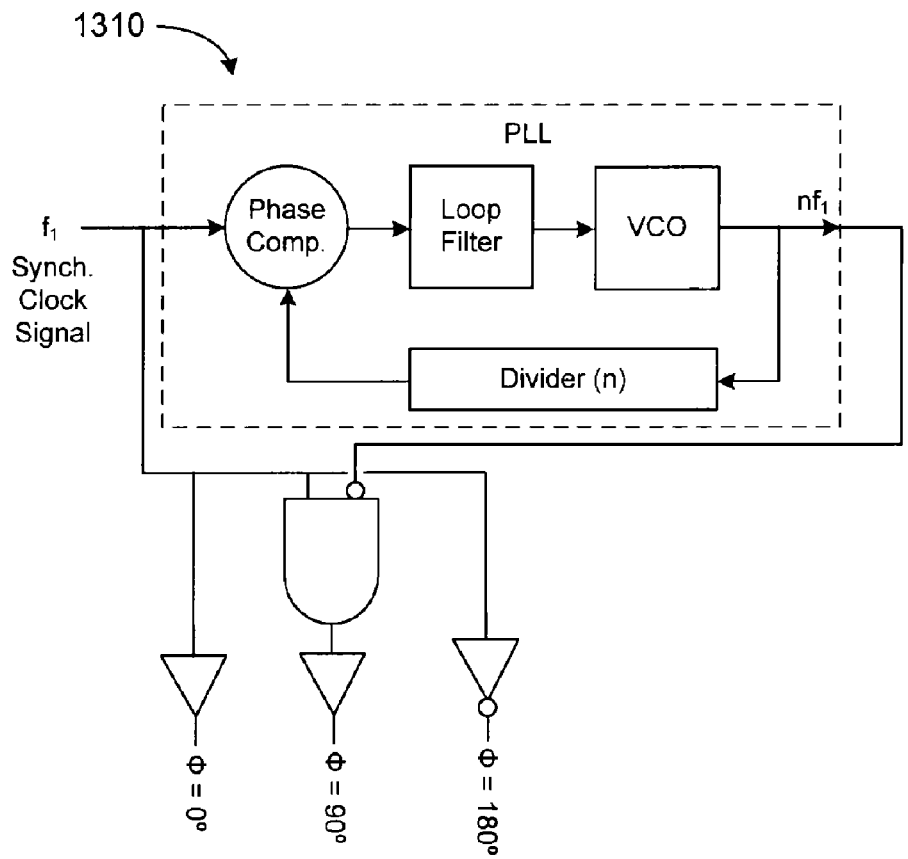
FIGS. 13A-13B and 14A-14B are graphical representations of embodiments of the clock delay control of FIG. 2A comprising a simplified phase locked loop in accordance with the present disclosure.
Figure 13B:
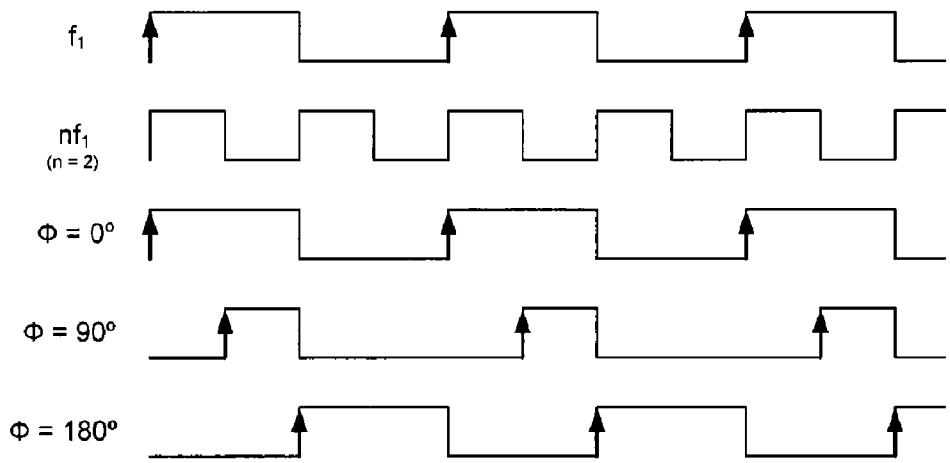
Figure 14A:
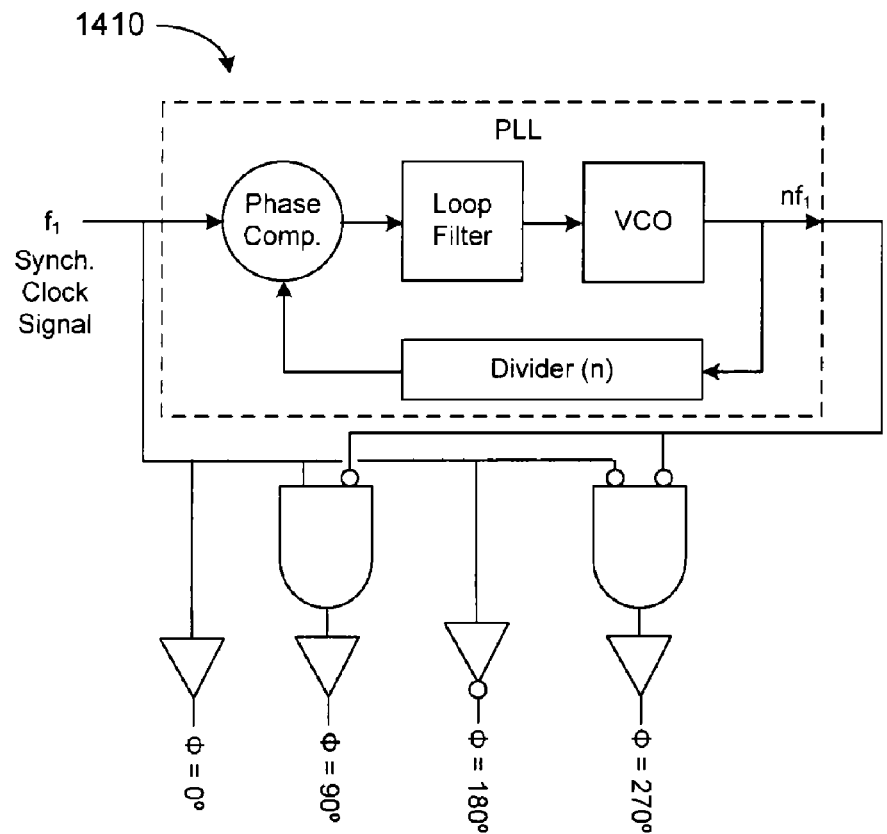
Figure 14B:
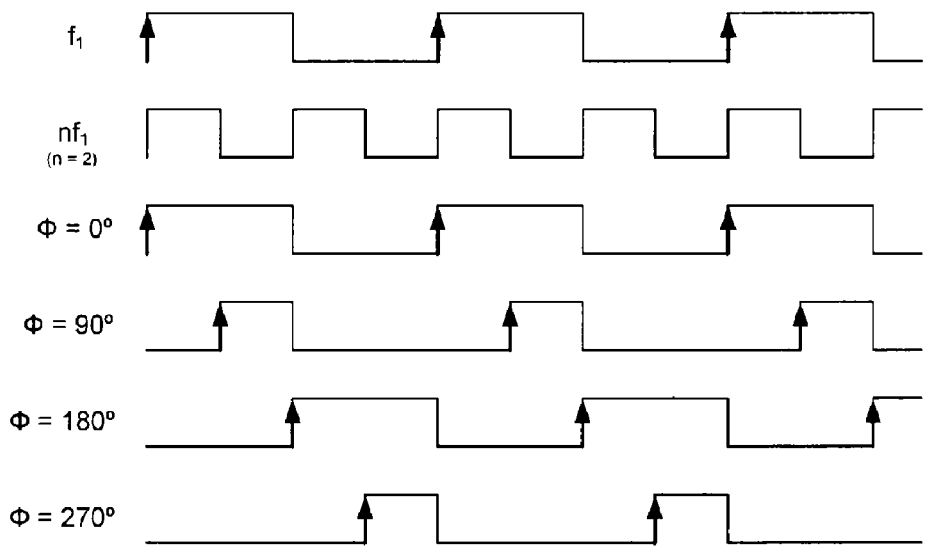

FIGS. 13A-13B are a graphical representation of another embodiment of the clock delay control 220 of FIG. 2A comprising a simplified phase locked loop 1310 in accordance with the present disclosure. In the exemplary embodiment of FIG. 13A, three phases (0, 90, and 180 degrees) are available for selection and utilization as a clocking input to one or more appropriate combinational logic group. The shift between each of the phase outputs is illustrated in FIG. 13B. By changing the divider (n), the phase separation between the phase outputs may be changed. FIGS. 14A-14B are a graphical representation of a different embodiment of the clock delay control 220 comprising the simplified phase locked loop 1410 in accordance with the present disclosure. In the embodiment of FIG. 14A, four phases (0, 90, 180, and 270 degrees with outputs as illustrated in FIG. 14B) are available for selection and utilization as a clocking input to one or more appropriate combinational logic group. The embodiment of FIGS. 14A-14B can be used to cascade combinational logic groups where one group is receives a synchronizing clock signal after the mid-point of the clock period (see e.g., FIG. 8).

The manner of clock phase selection for each combinational logic group depends on the limiting propagation time ascribed to the particular combinational logic group. In addition, total or aggregate power-bus and/or power supply current distribution may be considered in the clock phase selection. In some embodiments, the combinational logic groups remain connected to the same phase output regardless of changes the synchronizing clock frequency, $f_1$. It should be noted that the delay time between phases scales with changes in the synchronizing clock frequency, $f_1$. In other embodiments, a plurality of phase locked loops operating with different divider constants (n) may be utilized to provide different phase selections. A digital mux may be utilized to select delay signal from the available phase outputs. In addition, the use of a mux allows for dynamic adjustment of the power-bus current to minimize peak current, rms current, and/or di/dt (power or ground bus voltage perturbation or voltage drop).

Figure 15A:
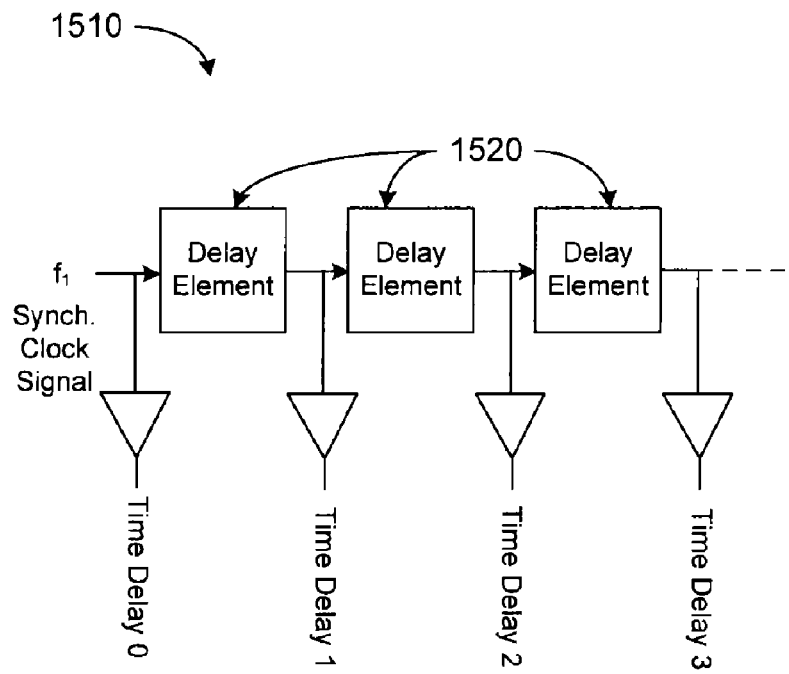
FIGS. 15A-15C are graphical representations of other embodiments of the clock delay control of FIG. 2A comprising a tapped delay line in accordance with the present disclosure.
Figure 15B:
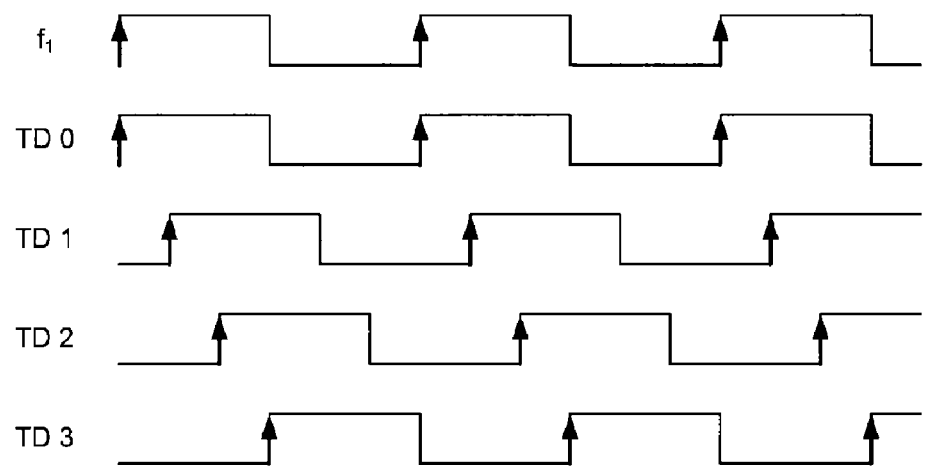
Figure 15C:
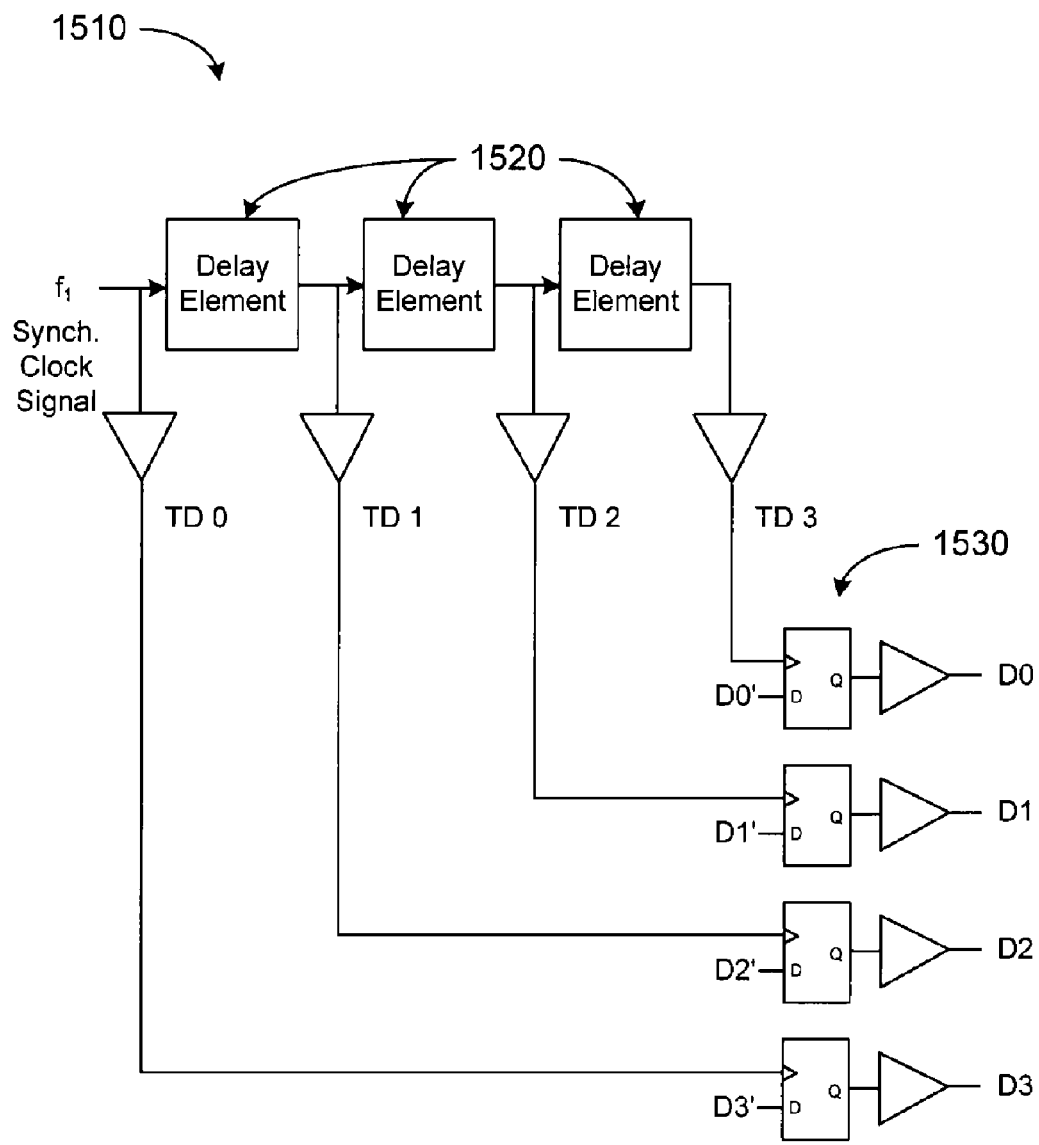

FIGS. 15A-15C are graphical representations of other embodiments of the clock delay control 220 of FIG. 2A comprising a tapped delay line 1510 in accordance with the present disclosure. In the exemplary embodiment of FIG. 15A, four time delay outputs (TD 0, TD 1, TD 2, TD 3) are available for selection and utilization as a clocking input to one or more appropriate combinational logic group. While the embodiment of FIG. 15A depicts three delay elements 1520, more or less delay elements and time delay outputs may be used. In this embodiment, the time delay between outputs is dependent upon the chip delay (e.g., a function of process, bus voltage, and chip temperature, PVT). The shift between each of the time delay outputs is illustrated in FIG. 15B. As noted above, in some embodiments, the combinational logic groups remain connected to the same time delay output regardless of changes the synchronizing clock frequency, $f_1$. In other embodiments, a digital mux may be employed to allow for a selected one of the time delay outputs to be supplied to a corresponding combinational logic group. In addition, the use of a mux allows for dynamic adjustment of the power-bus current to reduce or minimize di/dt (power or ground bus voltage perturbation or voltage drop), peak power-bus current, and/or rms power-bus current. Minimizing rms power-bus current minimizes IC power since power is the product of rms current and power-bus rms voltage.

This configuration is particularly useful for shifting the transition time of registered output buffers 1530 as shown in FIG. 15C to reduce aggregate simultaneous switching output ground bus and supply bus noise leading to or exacerbating system noise and EMI (electromagnetic interference). This configuration is useful to reduce crosstalk between buffers and the corresponding bus structures connected to the buffers. Additionally, this configuration is useful in shifting the input clocking temporally in time away from the output cell's transition time to preclude input cell loss-of-noise margin due to output cell transitioning induced ground bounce. This reduction in input cell power and ground bus noise reduces input cell jitter or timing uncertainty in applications such as high-speed communications (e.g., SERDES) and mixed-signal applications (e.g., ADC/DAC data converters).

Another advantage of the configuration depicted in FIG. 15C is that peak power-bus current and power-bus di/dt is reduced during output cell transitioning. Reduced power-bus peak current reduces power-bus voltage drop due to the interaction of peak current with power-bus resistance. Similarly, reduced power-bus di/dt reduces power-bus voltage drop due to the interaction of peak current with power-bus inductance. Both of these reductions afford improved power-bus power integrity by reducing power-bus voltage drops and ground bounce, and reduce the power-bus or power supply decoupling capacitor needs (whether incorporated within the IC, within the IC packaging, or within or on the printed circuit board containing the IC). Furthermore, the reduced power-bus peak current and reduced power-bus di/dt reduces the power-bus current variance and reduces power-bus rms current. Reduced power-bus rms current reduces the IC power consumption.

Figure 16A:
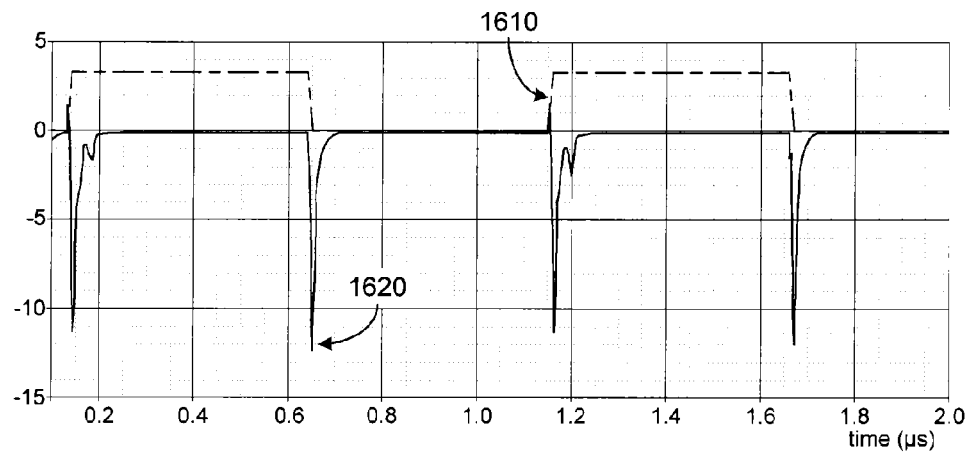
FIGS. 16A-16C are illustrations of the effect on the power-bus current produced by delaying the synchronizing clock signal to the combinational logic groups of FIG. 2A in accordance with one embodiment of the present disclosure.
Figure 16B:
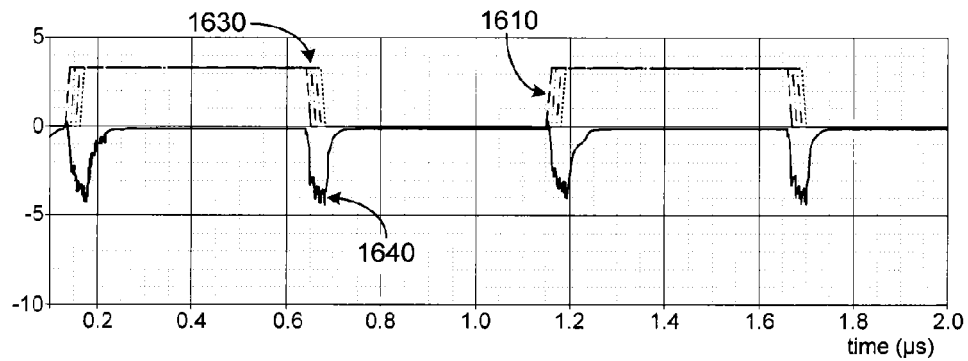
Figure 16C:
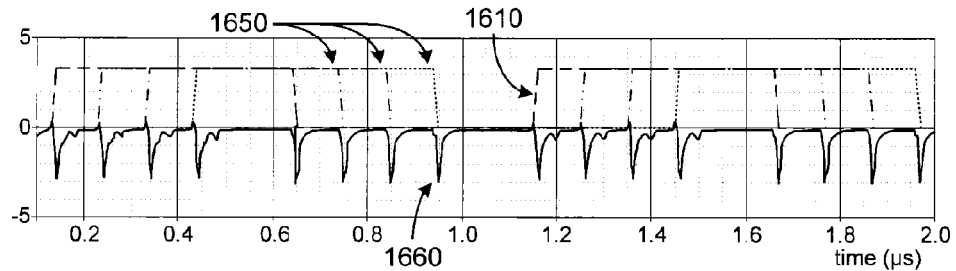

FIGS. 16A-16C illustrate the effects of delaying the synchronizing clock signal provided to four identical combinational logic groups. In the embodiment of FIG. 16A, a traditional synchronous clock system was simulated by supplying all four combinational logic groups with the master synchronizing clock signal 1610 without delay or clock shift. The period of the clock signal 1610 is extended to clearly depict the power-bus current 1620 that occurs as a direct result of all combinational logic groups clocking at the same time. As can be seen in FIG. 16A, a peak power-bus current of approximately 12 amps is produced by the simultaneous clocking of the combination logic groups.

In comparison, when the clocking signals supplied to each of the combinational logic groups is shifted, the peak power-bus current and power-bus di/dt can be reduced significantly. This is illustrated by the embodiment of FIG. 16B, where the master synchronizing clock signal 1610 is supplied to a first combinational logic group and delayed clocking signals 1630 are supplied to the other three combinational logic groups. The delayed clocking signals 1630 are each delayed by two percent of the synchronizing clock period. Even with this small shift in the clocking signals, the peak power-bus current 1640 is reduced to approximately 4 amps and the di/dt and variance of the power-bus current is reduced, and thus improved. In addition, the rms current level is reduced from 1.85 A without any delay of the synchronizing clock signals to 1.27 A with the 2% clock shifts. Consequently, the IC power is reduced by approximately 31% with no loss of logic function.

Increased delays in the synchronizing clock signals may produce further reductions in the power-bus current effects. The embodiment of FIG. 16C illustrates a 20% shift of the synchronizing clock signals. In this case, the master synchronizing clock signal 1610 is supplied to the first combinational logic group and delayed clocking signals 1650 are supplied to the other three combinational logic groups. As depicted in FIG. 16C, the peak power-bus current 1660 is further reduced to approximately 3 amps. The contribution of each of the combinational logic groups on the power-bus current is individually evident.

Figure 17:
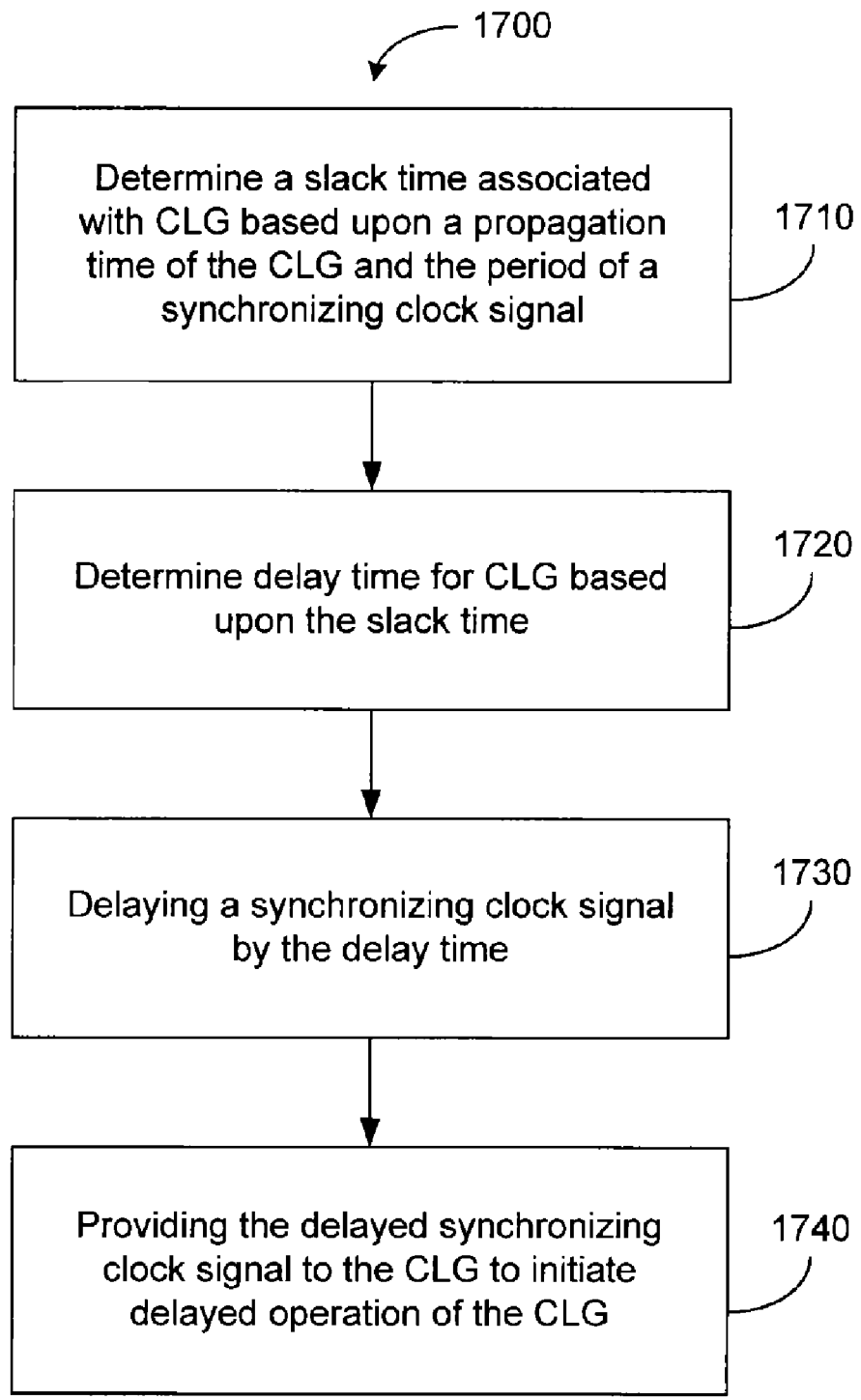
FIG. 17 is a flow diagram illustrating a method for providing a delayed synchronizing clock signal to a combinational logic group in accordance with one embodiment of the present disclosure.

FIG. 17 is a flow diagram 1700 illustrating a method for providing a delayed synchronizing clock signal to a combinational logic group in accordance with one embodiment of the present disclosure. Beginning with block 1710, a slack time associated with a combinational logic group is determined based upon a propagation time of the combinational logic group and upon a period of a synchronizing clock signal. The slack time and synchronizing clock period was discussed above with respect to FIGS. 3A-3B. A delay time for the combinational logic group is determined in block 1720 based upon the slack time. The delay time is less than the slack time to ensure that propagation through the combinational logic group is complete before the next synchronizing period begins. The synchronizing clock signal is then delayed by the delay time in block 1730 and the delayed synchronizing clock signal is provided to the combinational logic group to initiate delayed operation of the combinational logic group in block 1740.

The clock delay control of certain embodiments of the present disclosure can be implemented in hardware, software, firmware, or a combination thereof. In some embodiment(s), the delay controller is implemented in software or firmware that is stored in a memory or computer readable storage medium and that is executed by a suitable instruction execution system or processor. If implemented in hardware, as in an alternative embodiment, the delay controller can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Other embodiments can include an integrated circuit system, comprising: a plurality of combinational logic groups, each combinational logic group including combinational logic having a maximum propagation time within a propagation range associated with the combinational logic group; a plurality of controllable clock delay elements, each clock delay element configured to provide a delayed clock signal to a corresponding one of the plurality of combinational logic groups; and a delay controller configured to control the delayed clock signal of at least a first clock delay element, the delay controller further configured to control the delay of the clock signal based upon a clock signal period of a synchronizing clock signal and upon a propagation time of the combinational logic group corresponding to the first clock delay element. The delayed clock signal of the first clock delay element may be delayed by approximately half the difference between the clock signal period and the propagation time of the corresponding combinational logic group. The delayed clock signal of at least a second of the plurality of clock delay elements may be delayed by approximately half the difference between the clock signal period and the propagation time of the combinational logic group corresponding to the second clock delay element. The delay of both the delayed clock signals of the first and second clock delay elements may be offset by the same amount. The delayed clock signal of the first clock delay element may be delayed by at least the propagation time of a combinational logic group corresponding to at least a second of the plurality of clock delay elements when the clock signal period exceeds the sum of the propagation times of the combinational logic groups corresponding to the first and second clock delay elements. The delayed clock signal of the first clock delay element may be pseudo-randomly delayed for each sequential clock signal period, the pseudo-random delay less than the difference between the clock signal period and the propagation time of the corresponding combinational logic group. The delay controller may be configured to dynamically control the delay of the delayed clock signal of the first clock delay element based on changes in the clock signal period. The delay controller may control the delayed clock signals corresponding to at least two of the plurality of combinational logic groups to cascade the operation of the at least two combinational logic groups in response to the clock signal period exceeding the sum of the propagation times of the at least two combinational logic groups. The integrated circuit system may further comprise a current monitor configured to monitor a current characteristic of at least one of the plurality of combinational logic groups. The delay controller may utilize the monitored current characteristic to reduce power-bus rms current level. The delay controller may utilize the monitored current characteristic to reduce power-bus peak current level. The propagation time of the combinational logic group may be a limiting propagation time based upon the maximum propagation time of the combinational logic associated with the combinational logic group.

Other embodiments can include an integrated circuit system, comprising: a plurality of combinational logic groups, each combinational logic group having a propagation time;

and means for delaying a synchronizing clock signal supplied to at least one of the plurality of combinational logic groups based upon a period of the synchronizing clock signal and the propagation time of the at least one combinational logic group. The means for delaying the synchronizing clock signal dynamically may adjust the delay based upon changes in the period of the synchronizing clock signal. The means for delaying the synchronizing clock signal may be configured to distribute the operation of the combinational logic groups within the period of the synchronizing clock signal. The operation of the combinational logic groups may be distributed at selected phases of the synchronizing clock signal. The means for delaying the synchronizing clock signal may comprise a phase locked loop. The operation of the combinational logic groups may be distributed at selected time delays. The means for delaying the synchronizing clock signal may comprise a delay locked loop.

Other embodiments can include a method, comprising: determining a slack time associated with a combinational logic group based upon a propagation time of the combinational logic group and upon a period of a synchronizing clock signal; determining a delay time for the combinational logic group based upon the slack time, the delay time less than the slack time; delaying the synchronizing clock signal by the delay time; and providing the delayed synchronizing clock signal to the combinational logic group to initiate delayed operation of the combinational logic group. The method may further comprise: determining the sum of the propagation times of a plurality of combinational logic groups; and cascading the operation of the plurality of combinational logic groups if the sum is less than the period of the synchronizing clock signal. The propagation time of the combinational logic group may be a limiting propagation time.

Other embodiments can include a method for reducing power consumption by a combinational logic circuit, comprising: delaying a clock signal to produce a delayed clock signal; and communicating the clock signal and the delayed clock signal to separate groups of the combinational logic circuit during a clock cycle that results in a reduction in power consumption by the combinational logic circuit. The method may further comprise delaying the clock signal to produce a plurality of delayed clock signals, each of the delayed clock signals communicated to separate groups of the combinational logic circuit during the clock cycle. Each of the plurality of delayed clock signals may be delayed by a multiple of a predetermined constant. Each of the plurality of delayed clock signals may be delayed based upon a propagation time of the group that the delayed clock signal is communicated to and upon a period of the clock signal.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. An integrated circuit system, comprising:
a plurality of combinational logic groups, each combinational logic group including combinational logic having a maximum propagation time within a propagation range associated with the combinational logic group;
a plurality of controllable clock delay elements, each clock delay element configured to provide a delayed clock signal to a corresponding one of the plurality of combinational logic groups; and
a delay controller configured to control the delayed clock signal of at least a first clock delay element, the delay controller further configured to control the delay of the clock signal based upon a clock signal period of a synchronizing clock signal and upon a propagation time of the combinational logic group corresponding to the first clock delay element.

2. The integrated circuit system of claim 1, wherein the delayed clock signal of the first clock delay element is delayed by approximately half the difference between the clock signal period and the propagation time of the corresponding combinational logic group.

3. The integrated circuit system of claim 2, wherein the delayed clock signal of at least a second of the plurality of clock delay elements is delayed by approximately half the difference between the clock signal period and the propagation time of the combinational logic group corresponding to the second clock delay element.

4. The integrated circuit system of claim 3, wherein the delay of both the delayed clock signals of the first and second clock delay elements is offset by the same amount.

5. The integrated circuit system of claim 1, wherein the delayed clock signal of the first clock delay element is delayed by at least the propagation time of a combinational logic group corresponding to at least a second of the plurality of clock delay elements when the clock signal period exceeds the sum of the propagation times of the combinational logic groups corresponding to the first and second clock delay elements.

6. The integrated circuit system of claim 1, wherein the delayed clock signal of the first clock delay element is pseudo-randomly delayed for each sequential clock signal period, the pseudo-random delay less than the difference between the clock signal period and the propagation time of the corresponding combinational logic group.

7. The integrated circuit system of claim 1, wherein the delay controller is further configured to dynamically control the delay of the delayed clock signal of the first clock delay element based on changes in the clock signal period.

8. The integrated circuit system of claim 7, wherein the delay controller controls the delayed clock signals corresponding to at least two of the plurality of combinational logic groups to cascade the operation of the at least two combinational logic groups in response to the clock signal period exceeding the sum of the propagation times of the at least two combinational logic groups.

9. The integrated circuit system of claim 1, further comprising a current monitor configured to monitor a current characteristic of at least one of the plurality of combinational logic groups.

10. The integrated circuit system of claim 9, wherein the delay controller utilizes the monitored current characteristic to reduce power-bus rms current level.

11. The integrated circuit system of claim 9, wherein the delay controller utilizes the monitored current characteristic to reduce power-bus peak current level.

12. The integrated circuit system of claim 1, wherein the propagation time of the combinational logic group is a limiting propagation time based upon the maximum propagation time of the combinational logic associated with the combinational logic group.

13. An integrated circuit system, comprising:
a plurality of combinational logic groups, each combinational logic group having a propagation time; and
means for delaying a synchronizing clock signal supplied to at least one of the plurality of combinational logic groups based upon a period of the synchronizing clock signal and the propagation time of the at least one combinational logic group.

14. The integrated circuit system of claim 13, wherein the means for delaying the synchronizing clock signal dynamically adjusts the delay based upon changes in the period of the synchronizing clock signal.

15. The integrated circuit system of claim 13, wherein the means for delaying the synchronizing clock signal is configured to delay the synchronizing clock signal to distribute the operation of the combinational logic groups within the period of the synchronizing clock signal.

16. The integrated circuit system of claim 15, wherein the operation of the combinational logic groups is distributed at selected phases of the synchronizing clock signal.

17. The integrated circuit system of claim 16, wherein the means for delaying the synchronizing clock signal comprises a phase locked loop.

18. The integrated circuit system of claim 15, wherein the operation of the combinational logic groups is distributed at one of a plurality of selectable time delays.

19. The integrated circuit system of claim 18, wherein the means for delaying the synchronizing clock signal comprises a delay locked loop.

20. A method for reducing power consumption by a combinational logic circuit, comprising:
delaying a clock signal to produce a delayed clock signal; and
communicating the clock signal and the delayed clock signal to separate groups of the combinational logic circuit during a clock cycle that results in a reduction in power consumption by the combinational logic circuit.

21. The method of claim 20, further comprising:
delaying the clock signal to produce a plurality of delayed clock signals, each of the delayed clock signals communicated to separate groups of the combinational logic circuit during the clock cycle.

22. The method of claim 21, wherein each of the plurality of delayed clock signals is delayed by a multiple of a predetermined constant.

23. The method of claim 21, wherein each of the plurality of delayed clock signals is delayed based upon a propagation time of the group that the delayed clock signal is communicated to and upon a period of the clock signal.

24. A method for reducing decoupling capacitance in a combinational logic circuit, comprising:
delaying a clock signal to produce a delayed clock signal; and
communicating the clock signal and the delayed clock signal to separate groups of the combinational logic circuit during a clock cycle that results in a reduction in power-bus di/dt in the combinational logic circuit.

25. A method for reducing crosstalk in a combinational logic circuit, comprising:
delaying a clock signal to produce a delayed clock signal; and
communicating the clock signal and the delayed clock signal to separate groups of the combinational logic circuit during a clock cycle that results in a reduction in crosstalk in the combinational logic circuit.

26. A method for reducing power-bus peak current in a combinational logic circuit, comprising:
delaying a clock signal to produce a delayed clock signal; and
communicating the clock signal and the delayed clock signal to separate groups of the combinational logic circuit during a clock cycle that results in a reduction in power-bus peak current in the combinational logic circuit.

27. A method for reducing noise in a combinational logic circuit, comprising:
delaying a clock signal to produce a delayed clock signal; and
communicating the clock signal and the delayed clock signal to separate groups of the combinational logic circuit during a clock cycle that results in a reduction in power-bus di/dt in the combinational logic circuit.

28. The integrated circuit system of claim 1, wherein the maximum propagation time and the propagation range are predetermined.

29. The method of claim 20, wherein clocking of a group of the combinational logic circuit receiving the delayed clock signal is delayed with respect to clocking of a group of the combinational logic circuit receiving the clock signal.

* * * * *